US011776832B2

(12) United States Patent
Uenoyama

(10) Patent No.: US 11,776,832 B2
(45) Date of Patent: Oct. 3, 2023

(54) TRANSFER SYSTEM, TRANSFER DEVICE, AND TRANSFER METHOD

(71) Applicant: Murata Machinery, Ltd., Kyoto (JP)

(72) Inventor: Taito Uenoyama, Inuyama (JP)

(73) Assignee: Murata Machinery, Ltd., Kyoto (JP)

( * ) Notice: Subject to any disclaimer, the term of this patent is extended or adjusted under 35 U.S.C. 154(b) by 0 days.

(21) Appl. No.: 17/635,251

(22) PCT Filed: Jun. 16, 2020

(86) PCT No.: PCT/JP2020/023646
§ 371 (c)(1),
(2) Date: Feb. 14, 2022

(87) PCT Pub. No.: WO2021/039040
PCT Pub. Date: Mar. 4, 2021

(65) Prior Publication Data
US 2022/0293445 A1    Sep. 15, 2022

(30) Foreign Application Priority Data
Aug. 27, 2019  (JP) ................................. 2019-154520

(51) Int. Cl.
*H01L 21/677* (2006.01)
(52) U.S. Cl.
CPC .............................. *H01L 21/67766* (2013.01)
(58) Field of Classification Search
CPC .............................................. H01L 21/67766
See application file for complete search history.

(56) References Cited

U.S. PATENT DOCUMENTS

2014/0140794 A1*  5/2014  Adachi ................ B65G 1/0435
                                                              254/113
2019/0375593 A1* 12/2019  Sai ......................... B65G 1/065

FOREIGN PATENT DOCUMENTS

| JP | S50-11278 | 2/1975 |
| JP | S50-11278 U * | 2/1975 |
| JP | H3-015807 | 2/1991 |
| JP | 2592760 | 3/1999 |
| JP | H11-106007 | 4/1999 |
| WO | 2012/060146 A1 | 5/2012 |
| WO | WO-2012060146 A1 * | 5/2012 ....... H01L 21/67769 |

* cited by examiner

*Primary Examiner* — Gerald McClain
(74) *Attorney, Agent, or Firm* — DLA Piper LLP (US)

(57) ABSTRACT

A transfer system has a storage device including a plurality of shelves, each of the shelves including a placement portion in which an opening region is formed and on which the article is placed and an attaching portion provided according to a position of the placement portion; and a transfer device used for transferring the article, from the one side with respect to the transfer target shelf. The transfer device has a main unit portion attached to the attaching portion of the transfer target shelf from the one side, a moving portion including a grip portion and being capable of supporting the article and configured to move along the one direction, and an elevating portion configured to elevate the moving portion through the opening region of the transfer target shelf.

8 Claims, 13 Drawing Sheets

Fig.2
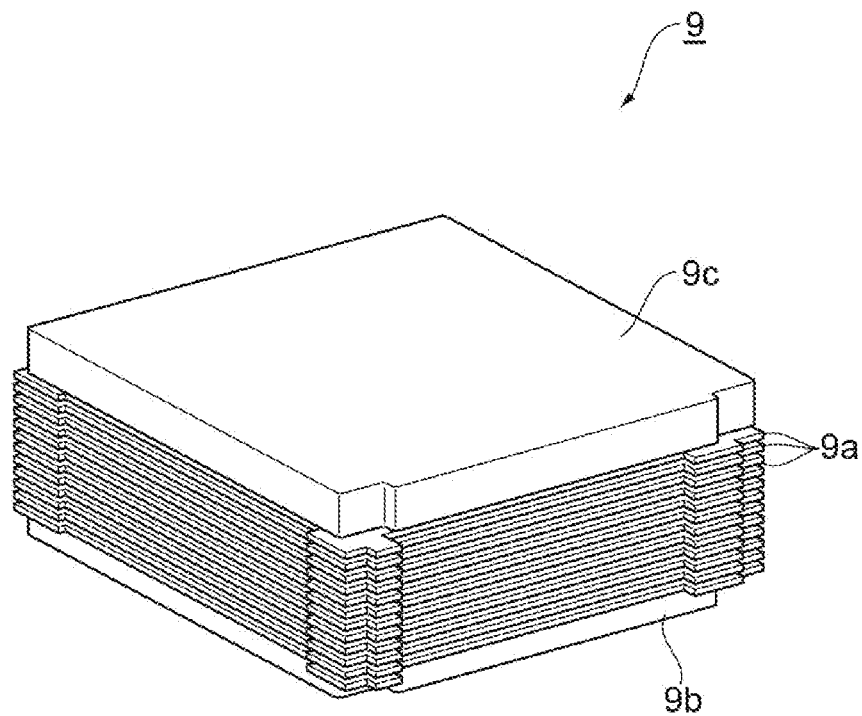
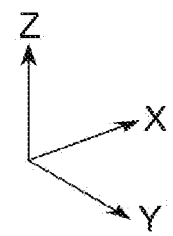

TRANSFER SYSTEM, TRANSFER DEVICE, AND TRANSFER METHOD

TECHNICAL FIELD

This disclosure relates to a transfer system, a transfer device, and a transfer method.

BACKGROUND

A storage system including a storage device including a plurality of shelves, a transfer device transferring an article to each of the shelves, and a control device controlling the operation of the transfer device has been known. In such a storage system, when it is not possible to transfer the article automatically due to a malfunction of the control device or the like, a need for a worker to manually transfer the article may arise.

If the need for the worker to manually transfer the article arises, it is conceivable to utilize a device such as a forklift truck described in Japanese Unexamined Patent Publication No. H11-106007, for example. The forklift truck described in Japanese Unexamined Patent Publication No. H11-106007 is a device to transfer the article using a trolley on a base pallet into which a fork is inserted.

When using a device such as a forklift truck described in Japanese Unexamined Patent Publication No. H11-106007, however, it needs to perform the positioning of the base pallet with respect to the shelf with high accuracy, and thus a high skill is needed for the worker, particularly in the operation of raising and lowering the lift.

Thus, it could be helpful to provide a transfer system, a transfer device, and a transfer method capable of allowing a worker to easily transfer an article regardless of the height of the shelf.

SUMMARY

I thus provide:

A transfer system includes a storage device including a plurality of shelves that are arrayed in an up-and-down direction and on which an article is transferred from one side in horizontal one direction, each of the shelves including a placement portion in which an opening region that is open in the up-and-down direction and open on the one side is formed and on which the article is placed, and an attaching portion provided according to a position of the placement portion in the up-and-down direction; and a transfer device used for transferring the article, with each of the shelves as a transfer target shelf, from the one side with respect to the transfer target shelf, in which the transfer device has a main unit portion attached to the attaching portion of the transfer target shelf from the one side, a moving portion capable of supporting the article and configured to move between the main unit portion and the transfer target shelf along one direction in a state where the main unit portion is attached to the attaching portion of the transfer target shelf, and an elevating portion configured to elevate the moving portion through the opening region of the transfer target shelf in a state where the main unit portion is attached to the attaching portion of the transfer target shelf.

With this transfer system, in the storage device, each of the shelves includes the attaching portion provided according to the position of the placement portion in the up-and-down direction, and in the transfer device, the moving portion is configured to be movable with respect to the transfer target shelf in a state where the main unit portion is attached to the attaching portion of the transfer target shelf. As a result, merely attaching the main unit portion of the transfer device to the attaching portion of the transfer target shelf, a worker can transfer the article to the transfer target shelf. Thus, the worker can transfer the article easily regardless of the height of the shelf.

The transfer device may further include a pair of attachments, each of the pair of attachments may include a connecting portion attached to the attaching portion of the transfer target shelf, and an extending portion extending from the connecting portion to the one side and configured to support the main unit portion, and the main unit portion may be attached to the attaching portion via the pair of attachments. According to this configuration, the main unit portion of the transfer device is supported by two extending portions extending from two connecting portions to the one side so that the article can be transferred in a stable state.

The connecting portion may extend along the up-and-down direction, and each of the pair of attachments may further include a reinforced portion bridged between the connecting portion and the extending portion. According to this configuration, the load capacity of the pair of attachments increases so that the article can be transferred in a stable state, even if the article is heavy, for example.

The elevating portion may be an air jack. According to this configuration, the transfer device can be made light in weight so that the transfer device can be attached to the attaching portion of the storage device more easily.

The transfer device may further include a guide configured to guide the moving portion along one direction, and the guide may extend from the main unit portion to directly below the opening region of the transfer target shelf in a state where the main unit portion is attached to the attaching portion of the transfer target shelf. According to this configuration, the moving portion is guided by the guide extending along the one direction so that the article can be transferred in a more stable state. In addition, as the worker merely attaches the main unit portion of the transfer device to the attaching portion of the transfer target shelf, the guide is in a state of extending directly below the opening region of the transfer target shelf so that an extra workload for the worker can be restricted from arising.

The guide may be a linear guide. According to this configuration, with a simple configuration, the article can be transferred in a more stable state.

The article may be a container storing a semiconductor wafer. According to this configuration, the container storing a semiconductor wafer that is a precision device can be easily transferred.

A transfer device is also a transfer device that is, in a storage device including a plurality of shelves that are arrayed in an up-and-down direction and on which an article is transferred from one side of horizontal one direction, each of the shelves including a placement portion in which an opening region that is open in the up-and-down direction and open on the one side is formed and on which the article is placed and an attaching portion provided according to a position of the placement portion in the up-and-down direction, used for transferring the article, with each of the shelves as a transfer target shelf, from the one side with respect to the transfer target shelf, the transfer device including: a main unit portion attached to the attaching portion of the transfer target shelf from the one side; a moving portion capable of supporting the article and configured to move between the main unit portion and the transfer target shelf along the one direction in a state where the main unit portion is attached to the attaching portion of the transfer target shelf; and an elevating portion configured to elevate the moving portion through the opening region of the transfer target shelf in a state where the main unit portion is attached to the attaching portion of the transfer target shelf.

Due to the above-described reasons, the worker can transfer the article easily and stably regardless of the height of the shelf.

A transfer method executed in the above-described transfer systems, and includes a first step of preparing the transfer device; a second step of, after the first step, attaching the main unit portion to the attaching portion of the transfer target shelf from the one side; a third step of, after the second step, moving the moving portion along the one direction to directly below the opening region of the transfer target shelf in a state where the moving portion is lowered; a fourth step of, after the third step, raising the moving portion through the opening region of the transfer target shelf by using the elevating portion and causing the moving portion to support the article; and a fifth step of, after the fourth step, moving the moving portion to the main unit portion along the one direction in a state where the moving portion is raised.

Due to the above-described reasons, the worker can transfer the article easily and stably regardless of the height of the shelf.

It is thus possible to provide a transfer system, a transfer device, and a transfer method capable of allowing a worker to easily transfer an article regardless of the height of the shelf.

BRIEF DESCRIPTION OF THE DRAWINGS

FIG. 2 is a perspective view illustrating a container that the transfer device of the example transfers.

REFERENCE SIGNS LIST

Figure 1:
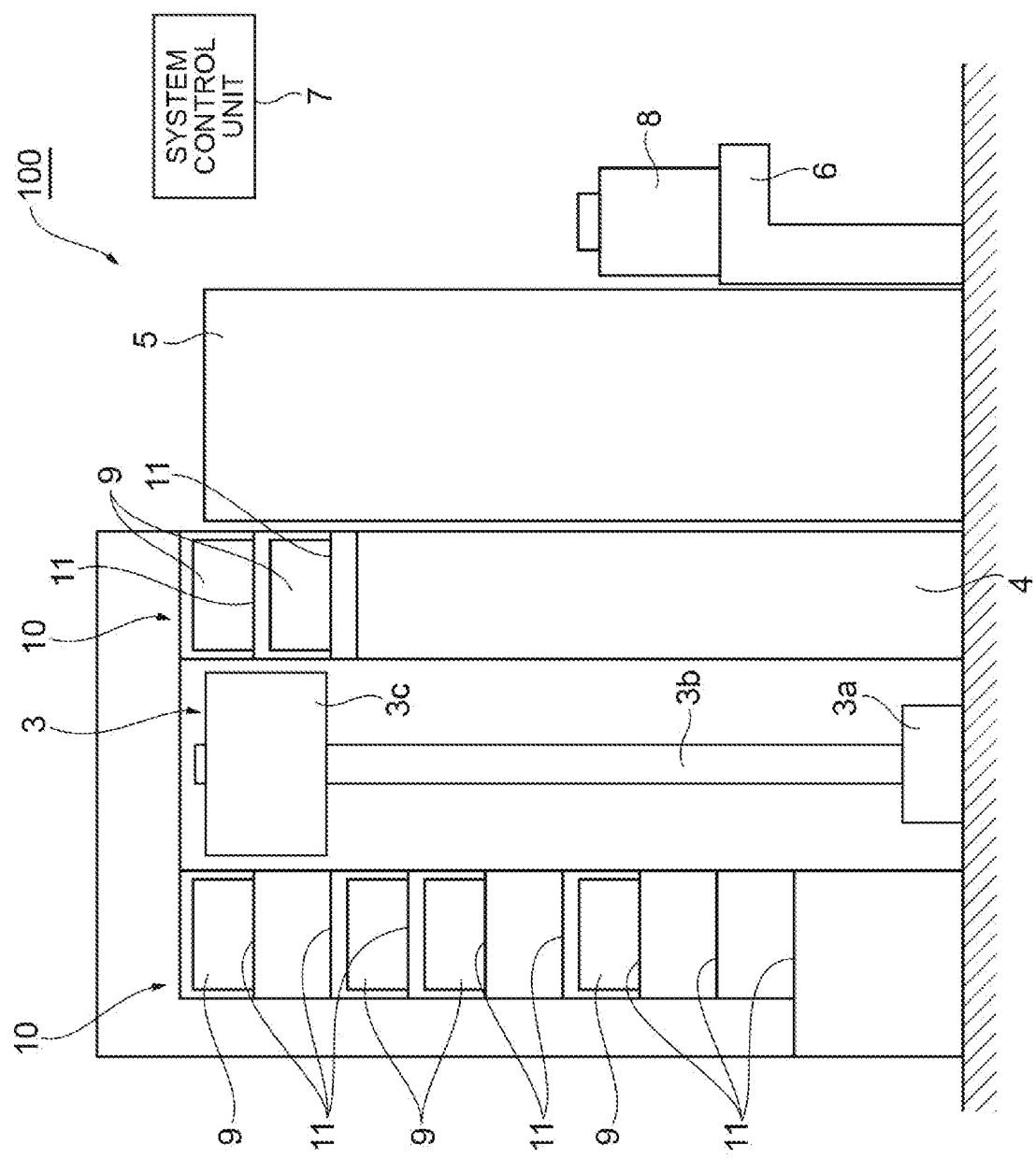
FIG. 1 is a side view of a storage system including a storage device in which a transfer device of one example is used.

1: transfer system
9: container
9b: bottom portion
10: storage device
11: shelf
14: placement portion
14a: opening region
15: attaching portion
20: transfer device
30: main unit portion
40: moving portion
50: elevating portion
60: guide
61: linear guide
70: attachment
80: connecting portion
90: extending portion
99: reinforced portion
100: storage system

DETAILED DESCRIPTION

The following describes an example in detail with reference to the accompanying drawings. In each of the drawings, identical or equivalent portions are denoted by identical reference signs, and redundant explanations are omitted.

Configuration of Storage System

A storage system including a storage device in which a transfer device of one example is used will be described. As illustrated in FIG. 1, a storage system 100 includes a pair of storage devices 10, a crane 3, a ring opener 4, a transport machine 5, a port 6, and a system control unit 7. In the following description, each axis direction in the Cartesian coordinate system in three-dimensional space is referred to as an X-direction, a Y-direction, and a Z-direction. Of those, the Y-direction is horizontal one direction and the Z-direction is the up-and-down direction (vertical direction).

The pair of storage devices 10 are arranged to face each other at an interval in the Y-direction. The storage device 10 arranged on one side in the Y-direction is provided above the ring opener 4. Each storage device 10 has a plurality of shelves 11 storing a container (article) 9. In each storage device 10, the shelves 11 are arrayed in the X-direction and the Z-direction. In each shelf 11, the container 9 is transferred from the crane 3 side (one side) in the Y-direction. When each shelf 11 is used as a reference, the crane 3 side is referred to as the front side and the opposite side is referred to as the rear side.

As illustrated in FIG. 2, the container 9 is a container storing semiconductor wafers. The container 9 has rings 9a, a bottom portion 9b, and an upper lid portion 9c. The container 9 has a plurality of rings 9a on which a holding portion holding the wafer is provided. Each ring 9a constitutes a tray on which the wafer is placed. Each ring 9a holds the semiconductor wafer inside and protects the outer perimeter of the semiconductor wafer. Each ring 9a is a member of a rectangular plate frame on which a circular opening as viewed from the Z-direction is formed, for example. The rings 9a are stacked alternately in the Z-direction to keep their sides airtight. In the bottom portion 9b, the stacked rings 9a are placed on the upper surface thereof. The upper lid portion 9c is arranged above the stacked rings 9a. The bottom portion 9b and the upper lid portion 9c are plate-like members, for example. The stacked rings 9a are held down toward the bottom portion 9b on the lower side by utilizing the weight of the upper lid portion 9c. The container 9 is capable of separating each of the stacked rings 9a. The bottom portion 9b has an opening that communicates the inside of the container 9 with the outside of the container 9. In the inside of the container 9, a purge gas is enclosed through the opening formed in the bottom portion 9b.

As illustrated in FIG. 1, the crane 3 is a transport device that transports the container 9. The crane 3 transfers the container 9 between the shelves 11 and the ring opener 4. The crane 3 is arranged in an area between the pair of storage devices 10. The crane 3 has a traveling portion 3*a*, a support column 3*b*, and a loading platform 3*c*. The traveling portion 3*a* travels along a track (depiction omitted) by a traveling drive portion such as a motor. The relevant track extends along the X-direction. The support column 3*b* extends upward from the traveling portion 3*a* along the Z-direction. The loading platform 3*c* is raised and lowered along the support column 3*b* by an elevating drive portion such as a motor. The loading platform 3*c* includes a loading platform on which the container 9 is placed, a swivel portion that adjusts the orientation of the container 9, and a transfer portion that transfers the container 9 to each of the shelves 11.

The ring opener 4 is arranged on one side in the Y-direction with respect to the crane 3. The ring opener 4 is a device that opens and closes a part between a plurality of rings 9*a* in the Z-direction so that the semiconductor wafer can be transferred with respect to the container 9 transported from each shelf 11 by the crane 3. When transferring the semiconductor wafer to a predetermined one or a plurality of rings 9*a*, the ring opener 4 opens a predetermined one or a plurality of places among the stacked rings 9*a*. When transferring the container 9 to the shelf 11 by the crane 3 after transferring the semiconductor wafer to the predetermined one or a plurality of rings 9*a*, the ring opener 4 closes the opened places among the rings 9*a*.

The port 6 is arranged on one side in the Y-direction with respect to the ring opener 4. That is, the port 6 is arranged, in the Y-direction, on the opposite side to the storage devices 10 as viewed from the ring opener 4. The port 6 is a portion to deliver a FOUP (Front Opening Unified Pod) 8 between a transport vehicle (depiction omitted) and the storage system 100. The transport vehicle is an overhead-traveling automatic guided vehicle that travels along a track provided on the ceiling of a semiconductor factory, for example.

The FOUP 8 is placed on the port 6 by the transport vehicle. The FOUP 8 has a box-shaped housing having an opening and a lid covering the opening. The lid is detachably provided with respect to the housing. In the FOUP 8, a plurality of semiconductor wafers and the like are accommodated, for example. The FOUP 8 has a flange that is held by the transport vehicle.

The transport machine 5 is arranged between the ring opener 4 and the port 6 in the Y-direction. The FOUP 8 is placed on the port 6 to be adjacent to the transport machine 5. The transport machine 5 is an EFEM (Equipment Front End Module). The transport machine 5 has an arm that can be inserted into the inside of the FOUP 8 or the inside of the container 9 and that can transfer the semiconductor wafer. The transport machine 5 has a function of removing the lid of the opening provided on the FOUP 8. The transport machine 5 has a function of transferring the semiconductor wafer between the ring 9*a* of the container 9 and the inside of the FOUP 8 by the arm. Specifically, the transport machine 5 takes out the semiconductor wafer from inside the ring 9*a* of the container 9 and stores the relevant semiconductor wafer inside the FOUP 8. At this time, in the container 9, the transport machine 5 takes out the semiconductor wafer from the container 9 by inserting the arm between a plurality of opened rings 9*a*. Alternatively, the transport machine 5 takes out the semiconductor wafer stored inside the FOUP 8 that is on the port 6 and stores the relevant semiconductor wafer inside the ring 9*a* of the container 9. At this time, the transport machine 5 takes out the semiconductor wafer from the FOUP 8 by inserting the arm into the inside of the FOUP 8 through the opening of the FOUP 8.

The system control unit 7 controls each operation of the storage system 100. The system control unit 7 is an electronic control unit including a CPU (Central Processing Unit), a ROM (Read Only Memory), a RAM (Random Access Memory) and the like. The system control unit 7 can be configured as software for which a program stored in the ROM is loaded onto the RAM and executed by the CPU, for example. The system control unit 7 may be configured as hardware by an electronic circuit or the like. The system control unit 7 may be including a single device or may be including a plurality of devices. When including multiple devices, the system control unit 7 is logically constructed as the multiple devices are connected via a communication network such as the Internet or an intranet. The system control unit 7 is connected to the crane 3, the ring opener 4, and the transport machine 5 in a wireless or wired manner and controls the operations of the crane 3, the ring opener 4, and the transport machine 5.

The operation of the storage system 100 transferring the semiconductor wafer from the inside of the container 9 stored in the storage device 10 to the FOUP 8 will be described. When the FOUP 8 is placed on the port 6 by the transport vehicle, the system control unit 7 initiates various controls. The crane 3 carries out the container 9 from each shelf 11 of the storage device 10 and moves it to the ring opener 4. The ring opener 4 opens a predetermined place of a plurality of stacked rings 9*a* in the Z-direction so that the semiconductor wafer can be taken out from the ring 9*a*. The transport machine 5 removes the lid of the FOUP 8. The transport machine 5 takes out the semiconductor wafer from the ring 9*a* of the container 9 and stores the semiconductor wafer inside the FOUP 8. When the FOUP 8 has stored a predetermined number of semiconductor wafers, the transport machine 5 closes the opening of the FOUP 8 that communicates by the lid. In this configuration, the predetermined number of semiconductor wafers is one semiconductor wafer or an upper limit number of semiconductor wafers that can be stored in the FOUP 8, and is 25 semiconductor wafers, for example. This completes the process of transferring from the container 9 to the FOUP 8 by the storage system 100.

The process of transferring the semiconductor wafer from the FOUP 8 to the inside of the container 9 by the storage system 100 is conducted by changing the target of carry-in and carry-out by the transport machine 5 in the above-described process. That is, out of the above-described process, the transport machine 5 takes out the semiconductor wafer from the inside of the FOUP 8 and stores the relevant semiconductor wafer to the ring 9*a* of the container 9. When the container 9 has stored a predetermined number of semiconductor wafers, the ring opener 4 closes a part between a plurality of rings 9*a* in the container 9 in the Z-direction and the crane 3 transfers the container 9 to each shelf 11. In this configuration, the predetermined number of semiconductor wafers is one semiconductor wafer or an upper limit number of semiconductor wafers that can be stored in the container 9, and is 25 semiconductor wafers, for example. This completes the process of transferring from the FOUP 8 to the container 9 by the storage system 100. This enables the storage system 100 to automatically perform transferring of the semiconductor wafers from the container 9 and FOUP 8.

Configuration of Transfer System and Transfer Device

Figure 3:
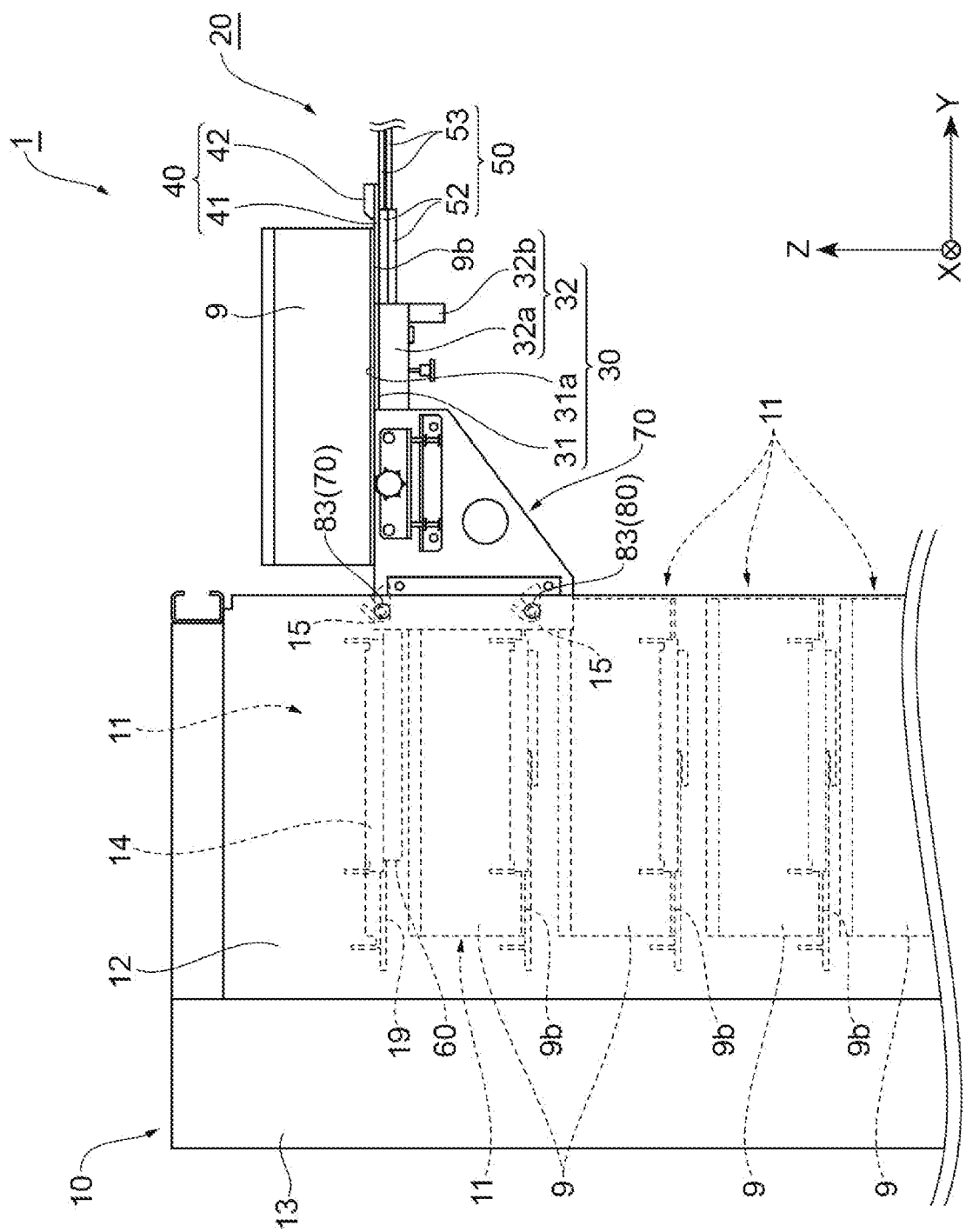
FIG. 3 is a side view of a transfer system of the example.
Figure 4:
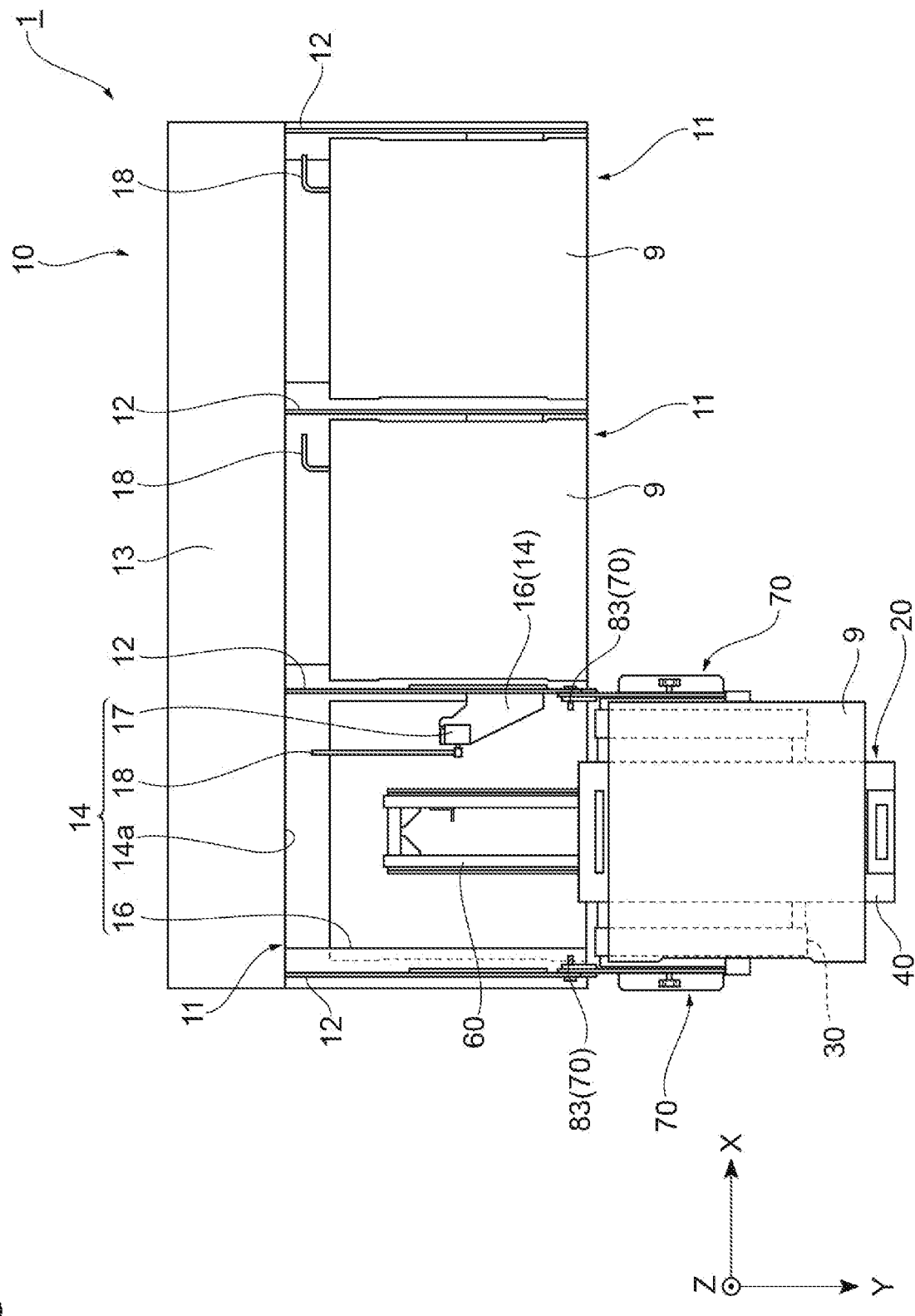
FIG. 4 is a plan view of the transfer system illustrated in FIG. 3.

As illustrated in FIGS. 3 and 4, in this example, a transfer system 1 including the storage device 10 and a transfer device 20. The transfer system 1 and the transfer device 20 can be used when the container 9 cannot be transferred automatically due to a malfunction and the like of the system control unit 7 of the storage system 100 and a worker transfers the container 9 to the storage device 10, for example. In the storage device 10, each of a plurality of shelves 11 to which the container 9 is transferred is the shelf 11 of a transfer target. In the transfer system 1, the worker enters between the pair of storage devices 10 where the crane 3 is provided and attaches the transfer device 20 to the transfer target shelf 11. The transfer device 20 is used to transfer the container 9 from the front side (one side in horizontal one direction) with respect to the transfer target shelf 11.

The storage device 10 further has a plurality of sidewall portions 12 and an inner wall portion 13. The sidewall portion 12 is a plate-like member extending in the Y-direction and the Z-direction. The sidewall portions 12 are each arranged to face each other at intervals in the X-direction. The sidewall portions 12 connect to the shelves 11. The transfer target shelf 11 is partitioned by a pair of sidewall portions 12 in the X-direction. The inner wall portion 13 connects to end portions on the rear side of the sidewall portions 12. The inner wall portion 13 is a plate-like member extending in the X-direction and the Z-direction. In the storage device 10, between two shelves 11 continuously arranged in the Z-direction, between two sidewall portions 12 continuously arranged in the X-direction, and on the front side, a transfer opening expanding in the X-direction and the Z-direction is formed. The transfer opening has a width (length in the X-direction) and a height (length in the Z-direction) at which the container 9 can be transferred. The container 9 is transferred, when transferred to the transfer target shelf 11, passing through the transfer opening from the front side to a space surrounded by two sidewall portions 12 and the inner wall portion 13. In the following description, when focused on the transfer target shelf 11, in the X-direction, the inside of a pair of sidewall portions 12 may be simply referred to as the inside and the outside of the pair of sidewall portions 12 may be simply referred to as the outside.

The transfer target shelf 11 includes a placement portion 14 and an attaching portion 15. On the placement portion 14, the container 9 is placed. In addition, on the placement portion 14, an opening region 14a that opens on the front side (one example of one side) and in the Z-direction is formed. The placement portion 14 has a pair of placement tables 16, a gas enclosing table 17, a gas pipe 18, and a space 19. The pair of placement tables 16 are each provided on the inside of the sidewall portions 12. Each of the pair of placement tables 16 is a plate-like member extending in the X-direction and the Y-direction and is a member supporting both ends of the container 9 in the X-direction. The pair of placement tables 16 are each connected to and supported by the inner surfaces of two sidewall portions 12 sandwiching the transfer target shelf 11. In the X-direction, between the pair of placement tables 16, there is an opening. When the container 9 is carried into the transfer target shelf 11, the pair of placement tables 16 supports the container 9 by coming into contact with the bottom portion 9b of the container 9.

The opening region 14a opens, in the transfer target shelf 11, in the Z-direction and to the front side. The opening region 14a is a space between the pair of placement tables 16. The opening region 14a communicates the upper and lower spaces on the front side of the inner wall portion 13. By the opening region 14a, at least the front side of the pair of placement tables 16 is not connected. The opening region 14a has a width (length in the X-direction) and a depth (length in the Y direction) at which a moving portion 40 of the transfer device 20, which will be described later, can be raised and lowered. The opening region 14a has a thickness (length in the Z-direction) the same as the thickness of the pair of placement tables 16, for example.

The gas enclosing table 17 and the gas pipe 18 communicate with a gas cylinder (depiction omitted) and ventilate the purge gas. The gas enclosing table 17 is provided, out of the pair of placement tables 16, on either one of the placement tables 16. The gas pipe 18 is a pipeline that communicates the gas enclosing table 17 with the gas cylinder. When the container 9 is placed on the placement portion 14 of the transfer target shelf 11, the container 9 is placed so that the opening formed on the bottom portion 9b engages with the gas enclosing table 17. As the purge gas is enclosed inside the container 9 via the opening formed on the bottom portion 9b, the gas enclosing table 17, and the gas pipe 18, the container 9 is subjected to a purge process.

Directly below the opening region 14a of the transfer target shelf 11, the space 19 is formed. Directly below the opening region 14a of the transfer target shelf 11 means the region between the opening region 14a of the relevant transfer target shelf 11 and the upper lid portion 9c of the container 9 stored in the shelf 11 one stage below the relevant transfer target shelf 11 (when the transfer target shelf 11 is the bottom stage, a region corresponding to the relevant region). The space 19 has a height (length in the Z direction) at which at least a guide 60 of the transfer device 20, which will be described later, can be inserted.

The attaching portion 15 is provided, in the transfer target shelf 11, according to the position of the placement portion 14 in the Z-direction. The transfer device 20 is attached to the transfer target shelf 11 by being connected to the attaching portion 15. The attaching portion 15 is provided at an end portion on the front side of the sidewall portion 12. The attaching portion 15 has a plurality of small holes into which attachment fasteners 83 of an attachment 70 in the transfer device 20, which will be described later, can be fitted inward.

The transfer device 20 has a main unit portion 30, the moving portion 40, an elevating portion 50, the guide 60, and a pair of attachments 70.

Figure 5:
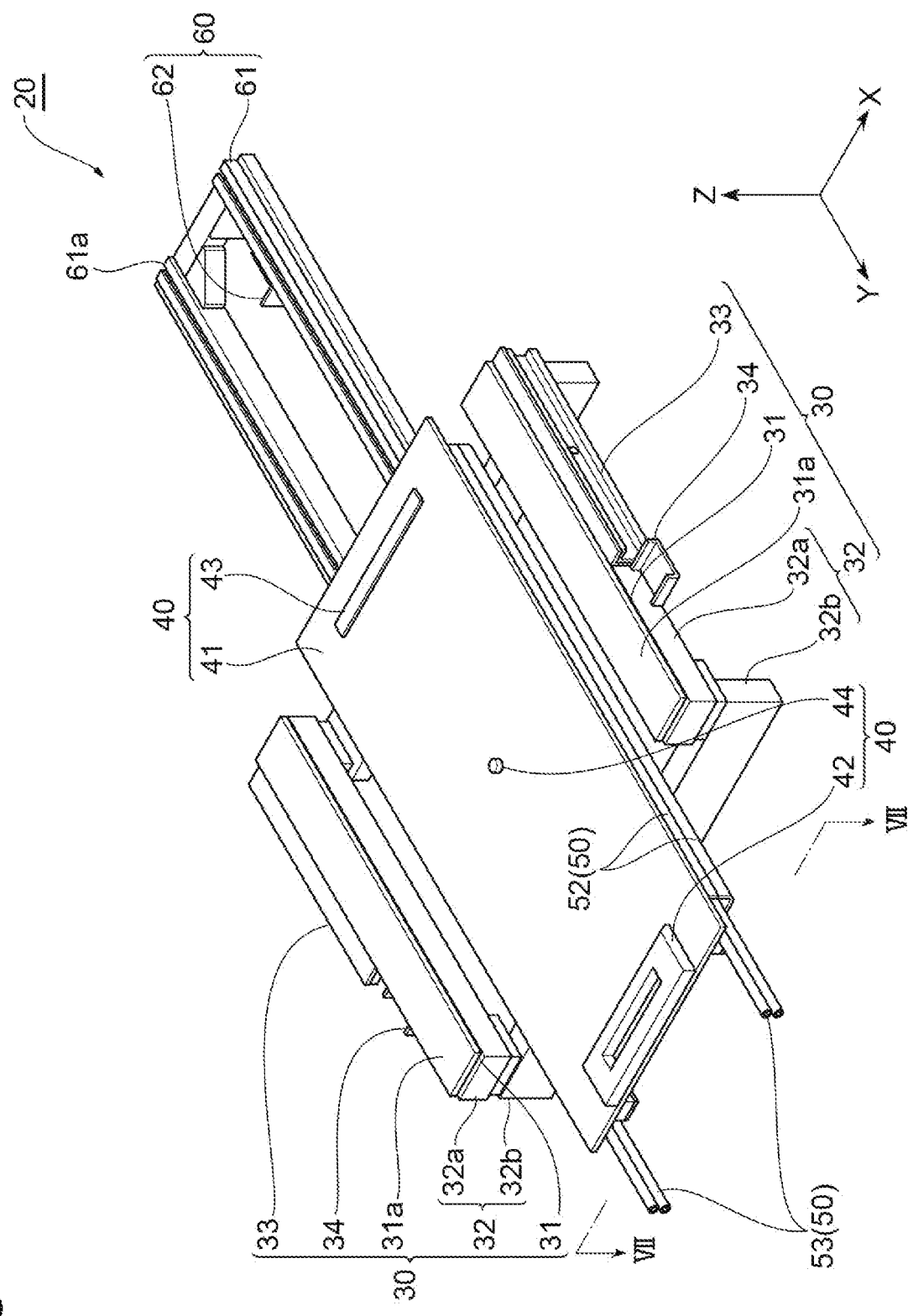
FIG. 5 is a perspective view of the transfer device of the example.

The main unit portion 30 is attached to the attaching portion 15 from the front side (one side). As illustrated in FIG. 5, the main unit portion 30 includes a pair of supporting portions 31, a frame body 32, a pair of engaging recessed portions 33, and a pair of engaging stoppers 34. The pair of supporting portions 31 can support the container 9. The pair of supporting portions 31 support both ends of the container 9 in the X-direction. Each of the pair of supporting portion 31 is a lengthy member extending in the Y-direction. The pair of supporting portions 31 can horizontally support the container 9 on each upper surface 31a.

The frame body 32 supports the pair of supporting portions 31. The frame body 32 including a pair of supporting members 32a that support the pair of supporting portions 31 and extend in the Y-direction and a pair of supporting members 32b that support the pair of supporting members 32a and extend in the X-direction. The frame body 32 including the pair of supporting members 32a and the pair of supporting members 32b has a rectangular frame shape as viewed from the Z-direction. The pair of supporting members 32a and the pair of supporting members 32b in the frame body 32 are lengthy members having a rectangular cross section with respect to the respective extending directions. Each upper surface of the pair of supporting members 32a is connected to the respective bottom surfaces of the pair of supporting portions 31. The end portion of each upper surface of the pair of supporting members 32b in the X-direction is connected to the end portion of the respective bottom surfaces of the pair of supporting members 32a in the Y-direction.

Each of the pair of engaging recessed portions 33 is provided on the respective outer surfaces of the pair of supporting members 32a. Each of the pair of engaging recessed portions 33 has a recessed portion extending in the Y-direction. Each of the pair of engaging recessed portions 33 has a small hole into which a body fastener 93 of the pair of attachments 70 which will each be described later can be fitted inward.

Each of the pair of engaging stoppers 34 is, in the Y-direction, provided on the respective outer surfaces of the pair of supporting members 32a to come into contact with or come close to the respective end portions on the front side of the pair of engaging recessed portions 33. Each of the engaging stopper 34 is provided projecting to cover a part of or the entire cross section with respect to the respective extending directions (Y-direction) of the pair of engaging recessed portions 33.

The moving portion 40 can support the container 9 and, in a state where the main unit portion 30 is attached to the attaching portion 15 of the transfer target shelf 11, moves between the main unit portion 30 and the transfer target shelf 11 along the Y-direction (one direction). The moving portion 40 is configured to be movable to the front side or rear side with respect to the attaching portion 15. The moving portion 40 includes a moving plate 41, a grip portion 42, a non-slip portion 43, and a protruding portion 44.

The moving plate 41 can support the container 9. The moving plate 41 has a plate shape. The length of the moving plate 41 in the Y-direction is a length longer than or the same as the length of the container 9 in the Y-direction. The moving plate 41 moves between the main unit portion 30 and the transfer target shelf 11 along the Y-direction (one direction). The grip portion 42 is provided on the moving plate 41. The grip portion 42 is gripped when the worker moves the moving plate 41. The worker grips the grip portion 42 and, by exerting the force on the front side or rear side, moves the moving plate 41 to the front side or rear side. The grip portion 42 is provided at the end portion on the front side on the moving plate 41. The grip portion 42 is made of resin, for example.

The non-slip portion 43 is provided on the moving plate 41 and prevents the container 9 from slipping off the moving plate 41. The non-slip portion 43 is provided at the end portion on the rear side on the moving plate 41. The non-slip portion 43 is made of resin, for example. When the container 9 is placed on the moving plate 41, the container 9 is placed between the grip portion 42 and the non-slip portion 43. The protruding portion 44 is provided on the moving plate 41 and positions the container 9 on the moving plate 41. The protruding portion 44 protrudes from the horizontal plane of the moving plate 41. By engaging the recess provided on the bottom portion 9b of the container 9 with the protruding portion 44, the movement of the container 9 in the horizontal direction is prevented. The protruding portion 44 connects to a screw provided below the moving plate 41 and, by the screw, the position of the upper end of the protruding portion 44 in the Z-direction is adjustable.

Figure 6:
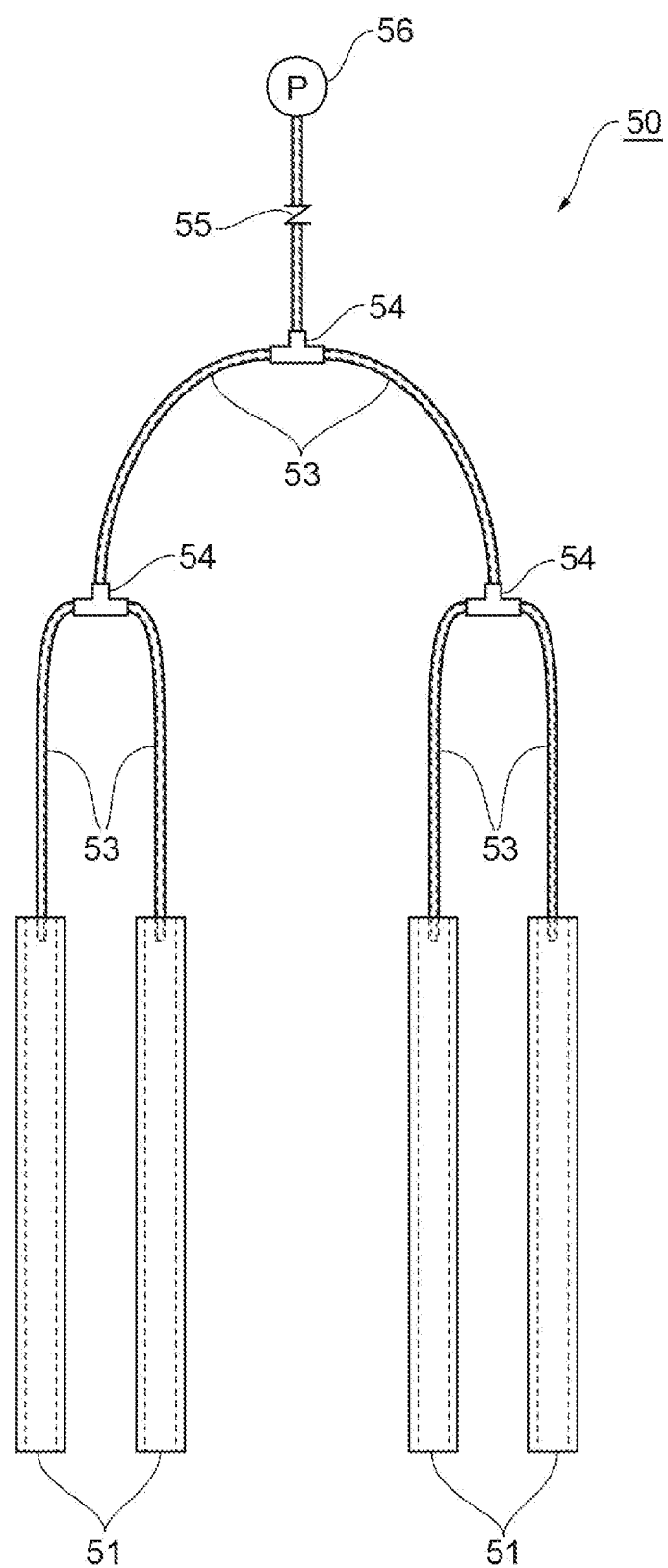
FIG. 6 is a cross-sectional view of an elevating portion of the transfer device illustrated in FIG. 5.

The elevating portion 50 raises and lowers the moving portion 40. The elevating portion 50 is an air jack. As illustrated in FIGS. 5 and 6, the elevating portion 50 includes a plurality of balloon portions 51, a pair of outer shells 52, a plurality of air tubes 53, a plurality of coupling tools 54, a check valve 55, and a manual pump 56. Each balloon portion 51 expands at least in the Z-direction as gas is supplied to the inside thereof and deflates at least in the Z-direction as gas is discharged from the inside thereof. Each balloon portion 51 is made of tubular silicon rubber, for example. One end of each balloon portion 51 is connected to each air tube 53. Both end portions inside each balloon portion 51 except for the air tube 53 are closed with liquid silicon, for example. Each balloon portion 51 is arranged to extend in the Y-direction below the moving plate 41. Each balloon portion 51 is arranged such that, to support the moving plate 41 horizontally, the center of the moving plate 41 and the center of each balloon portion 51 match in the Y-direction. The balloon portions 51 are each provided below the moving plate 41 along the Y-direction, at both edge sides on the outside of the moving plate 41. For one edge side along the Y-direction of the moving plate 41, a plurality of balloon portions 51 are stacked in the Z-direction.

The pair of outer shells 52 protect against physical contact at each balloon portion 51. Each of the pair of outer shells 52 is provided along the Y-direction on the outer circumference of the balloon portions 51 provided at one edge side along the Y-direction of the moving plate 41. Each outer shell 52 is a set of upper and lower members that separate up and down. Each outer shell 52 is connected to the upper surface of each supporting member 32b of the frame body 32 and the lower surface of the moving plate 41. When each balloon portion 51 is deflated, the set of the upper and lower outer shells 52 comes into contact with each other and has a tubular shape extending along the Y-direction. When each balloon portion 51 expands, the upper member out of the set of the upper and lower outer shells 52 rises, separating from the lower member. Each outer shell 52 is made of metal, for example.

Each air tube 53 is a pipeline that communicates each balloon portion 51 with the manual pump 56 via the respective coupling tools 54. Each air tube 53 extends from the end portion on the front side of each balloon portion 51 to the front side. Each air tube 53 can flow gas between each balloon portion 51 and the manual pump 56. Each air tube 53 is made of silicon rubber, for example. Each coupling tool 54 couples each air tube 53 extending from each balloon portion 51 between each balloon portion 51 and the check valve 55. Each coupling tool 54 couples each air tube 53 so that one air tube 53 includes each balloon portion 51 to the check valve 55. Each coupling tool 54 is made of metal, for example.

The check valve 55 is provided between each balloon portion 51 and the manual pump 56. Regardless of whether the check valve 55 is open or closed, the flow of gas from the manual pump 56 to each balloon portion 51 is not suppressed. When the check valve 55 opens the valve, gas flows from each balloon portion 51 to the manual pump 56. When the check valve 55 closes the valve, gas does not flow from each balloon portion 51 to the manual pump 56. The manual pump 56 can, by exerting a force by the worker, flow gas to each balloon portion 51 through each air tube 53. The manual pump 56 is an air pump, for example.

Figure 7A:
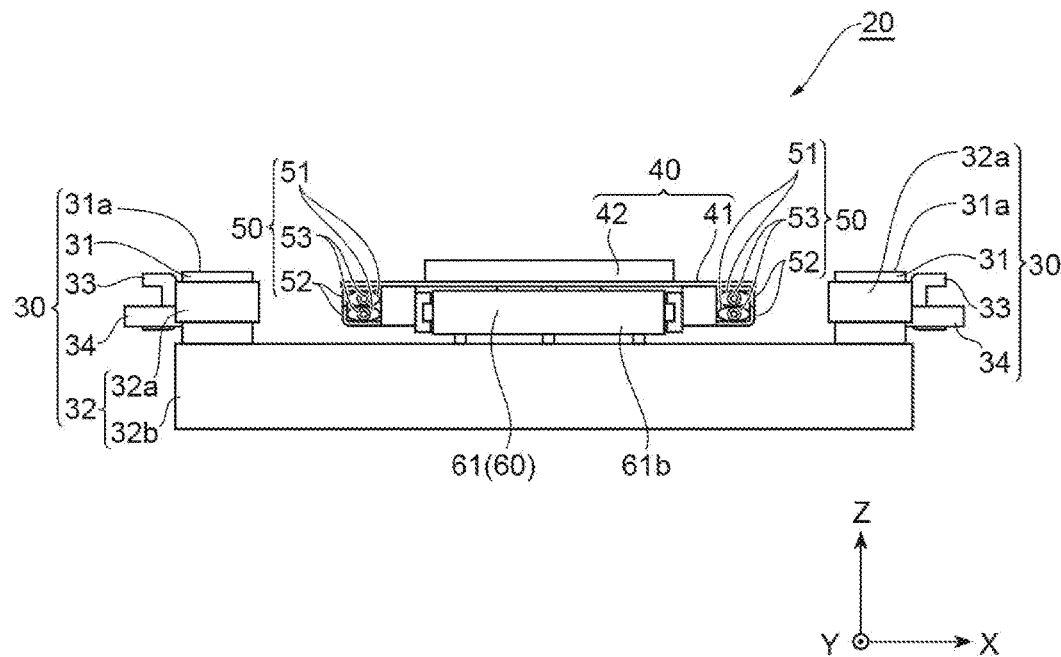
FIGS. 7(a) and 7(b) are cross-sectional views taken along the line VII-VII of the transfer device illustrated in FIG. 5.
Figure 7B:
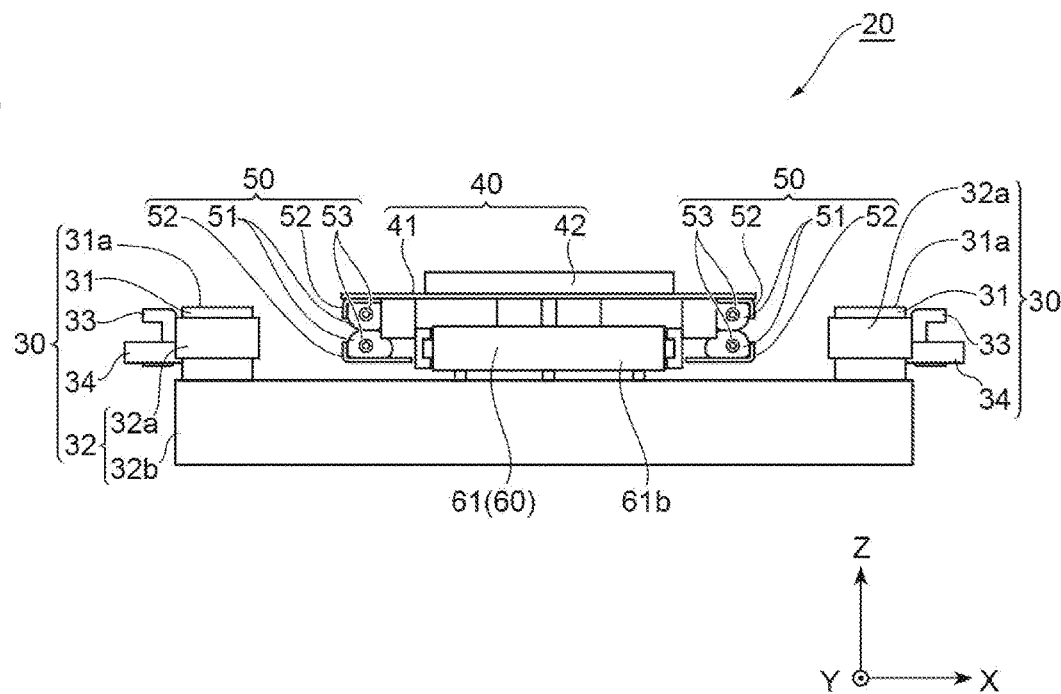

As illustrated in FIGS. 7(a) and 7(b), the elevating portion 50 raises and lowers the moving portion 40. FIG. 7(a) illustrates a state where the moving portion 40 is lowered. At this time, gas is not supplied from the manual pump 56 to the inside of each balloon portion 51 through each air tube 53, and each balloon portion 51 is in a deflated state. The moving plate 41 of the moving portion 40 is positioned below the upper surface 31a of each supporting portion 31 or at the same height as the upper surface 31a of each supporting portion 31. When the container 9 is placed on the transfer device 20 in a state where the moving plate 41 is positioned below the upper surface 31a of each supporting portion 31, the container 9 is supported only by the upper surface 31a of each supporting portion 31. When the container 9 is placed on the transfer device 20 in a state where the moving plate 41 is positioned at the same height as the upper surface 31a of each supporting portion 31, the container 9 is supported by the upper surface 31a of each supporting portion 31 and the moving plate 41.

FIG. 7(b) illustrates a state where the moving portion 40 has risen. At this time, as gas is supplied from the manual pump 56 to the inside of each balloon portion 51 through each air tube 53, each balloon portion 51 is in an expanded state. Each balloon portion 51 increases, by expanding, the height at least toward the Z-direction. As a result, the moving plate 41 of the moving portion 40 is positioned above the upper surface 31a of each supporting portion 31. When the container 9 is placed on the transfer device 20 in a state where the moving plate 41 is positioned above the upper surface 31a of each supporting portion 31, the container 9 is supported only by the moving plate 41.

Figure 8A:
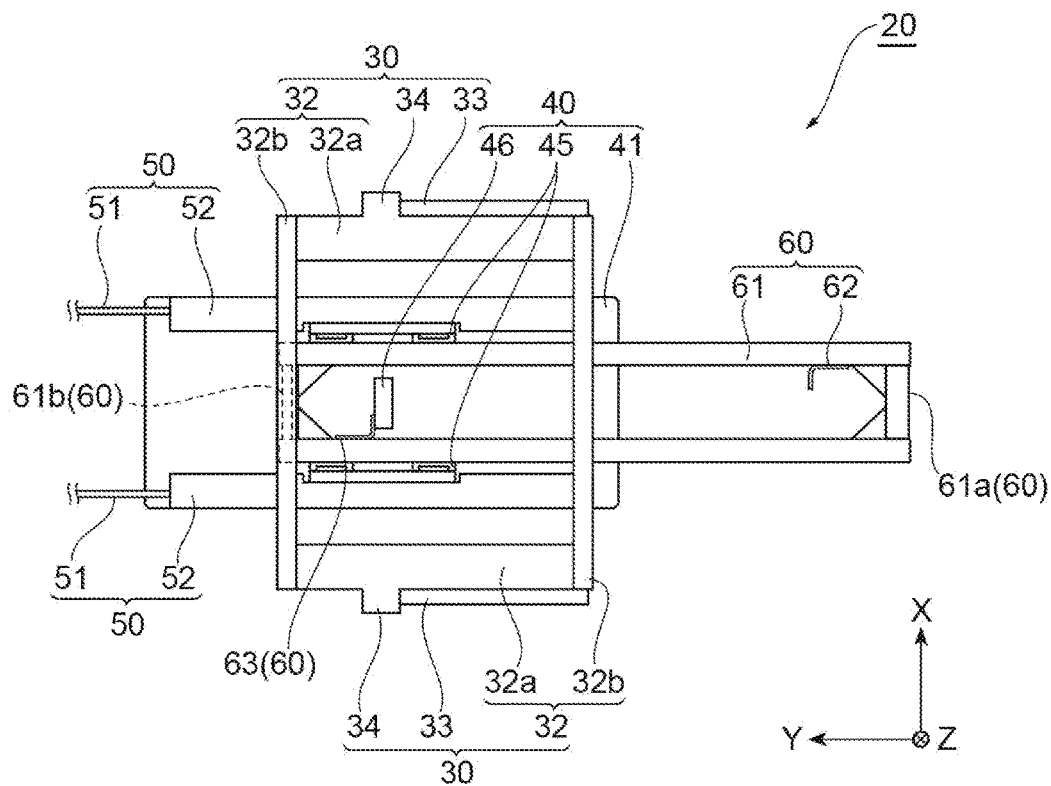
FIGS. 8(a) and 8(b) are bottom views of the transfer device illustrated in FIG. 5.
Figure 8B:
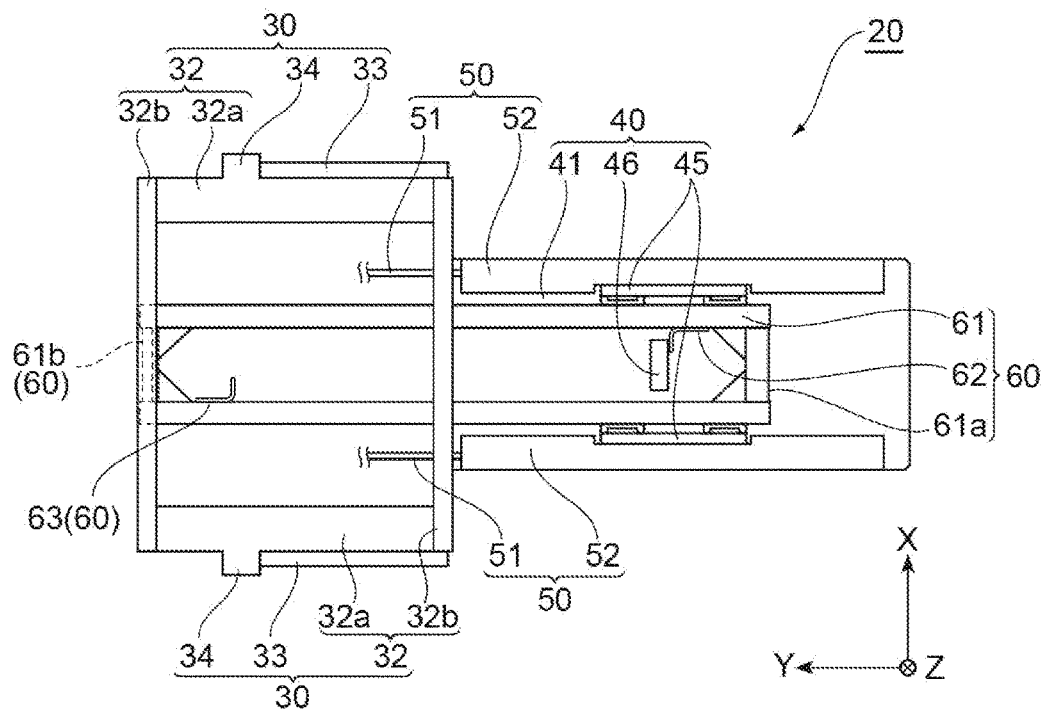

As illustrated in FIGS. 3, 8(a) and 8(b), the guide 60 guides the moving portion 40 along the Y-direction (one direction). FIG. 8(a) illustrates a state where the moving portion 40 is arranged on the front side. FIG. 8(b) illustrates a state where the moving portion 40 has moved to the rear side. The guide 60 is a linear guide. The guide 60 includes a linear guide 61, a carry-in stopper 62, and a carry-out stopper 63.

The linear guide 61 extends from the main unit portion 30 to directly below the opening region 14a of the transfer target shelf 11 in a state where the main unit portion 30 is attached to the attaching portion 15 of the transfer target shelf 11. When the main unit portion 30 is attached to the attaching portion 15, the linear guide 61 is inserted into the space 19 directly below the opening region 14a of the transfer target shelf 11. The linear guide 61 has a rectangular frame shape as viewed from the top. The linear guide 61 moves the moving plate 41 to the front side or the rear side by the portion extending in the Y-direction. An end portion 61a on the rear side of the linear guide 61 is, when the main unit portion 30 is attached to the transfer target shelf 11, arranged at a position close to the inner wall portion 13 of the storage device 10. An end portion 61b on the front side of the linear guide 61 extends to the supporting member 32b located on the front side as viewed from the center of the frame body 32.

The carry-in stopper 62 and the carry-out stopper 63 are provided on the linear guide 61 and project in the X-direction. The carry-in stopper 62 and the carry-out stopper 63 are provided inside the linear guide 61 and project inward. The carry-in stopper 62 is provided on the rear side as viewed from the center of the linear guide 61 and restricts the moving plate 41 from moving to the rear side. The carry-out stopper 63 is provided on the front side as viewed from the center of the linear guide 61 and restricts the moving plate 41 from moving to the front side.

As illustrated in FIGS. 8(a) and 8(b), the moving portion 40 includes sliders 45 and a contact portion 46. The sliders 45 are provided on the lower surface of the moving plate 41. The moving plate 41 is connected to the sliders 45 to be movable in the Z-direction. The slider 45 is a linear slider, for example. The sliders 45 are arranged on the outside of the member of the linear guide 61 extending in the Y-direction to sandwich the linear guide 61 of the guide 60 from the outside to the inside in the X-direction. The slider 45 moves between the main unit portion 30 and the opening region 14a of the transfer target shelf 11 together with the moving plate 41 along the linear guide 61.

The contact portion 46 is provided on the lower surface of the moving plate 41. The contact portion 46 is a substantially rectangular parallelepiped-like member, for example. The contact portion 46 restricts the moving portion 40 from moving by contacting the carry-in stopper 62 and the carry-out stopper 63. When the moving plate 41 moves to the rear side, the contact portion 46 and the carry-in stopper 62 are provided so that, after the moving plate 41 reaches the opening region 14a of the transfer target shelf 11 and before the end portion on the rear side of the moving plate 41 reaches the inner wall portion 13, the contact portion 46 comes into contact with the carry-in stopper 62. The contact portion 46 and the carry-in stopper 62 are provided when carrying out the container 9 from the transfer target shelf 11 to restrict the moving plate 41 from moving from the position of the moving plate 41 when the protruding portion 44 is located directly below the recess provided on the bottom portion 9b of the container 9 on the pair of placement tables 16. When the moving plate 41 moves to the front side, the contact portion 46 and the carry-out stopper 63 are provided so that, after the moving plate 41 moves to the front side relative to the opening region 14a of the transfer target shelf 11, the contact portion 46 comes into contact with the carry-out stopper 63.

Figure 9:
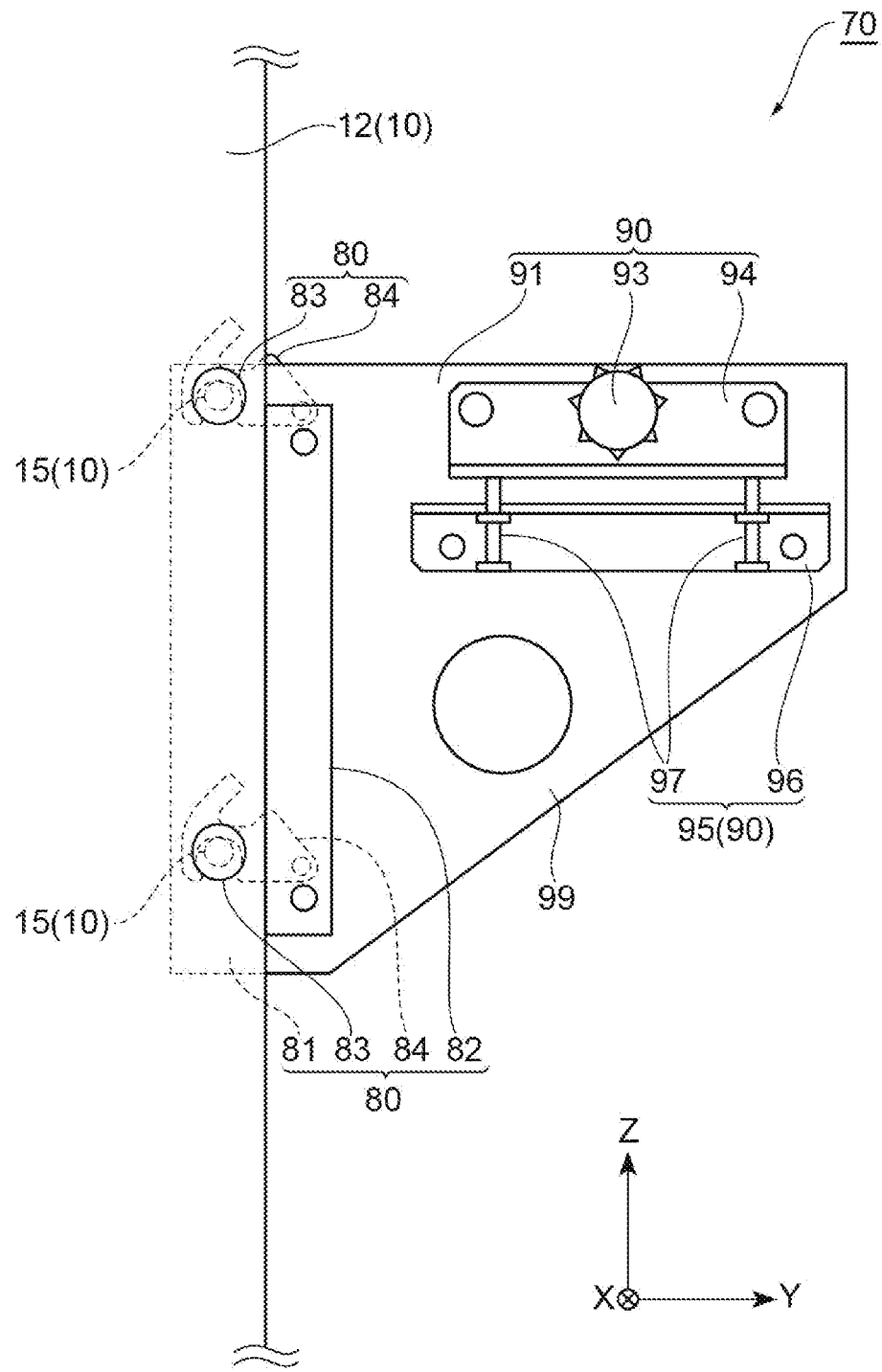
FIG. 9 is a side view of an attachment of the transfer device illustrated in FIG. 5.
Figure 10:
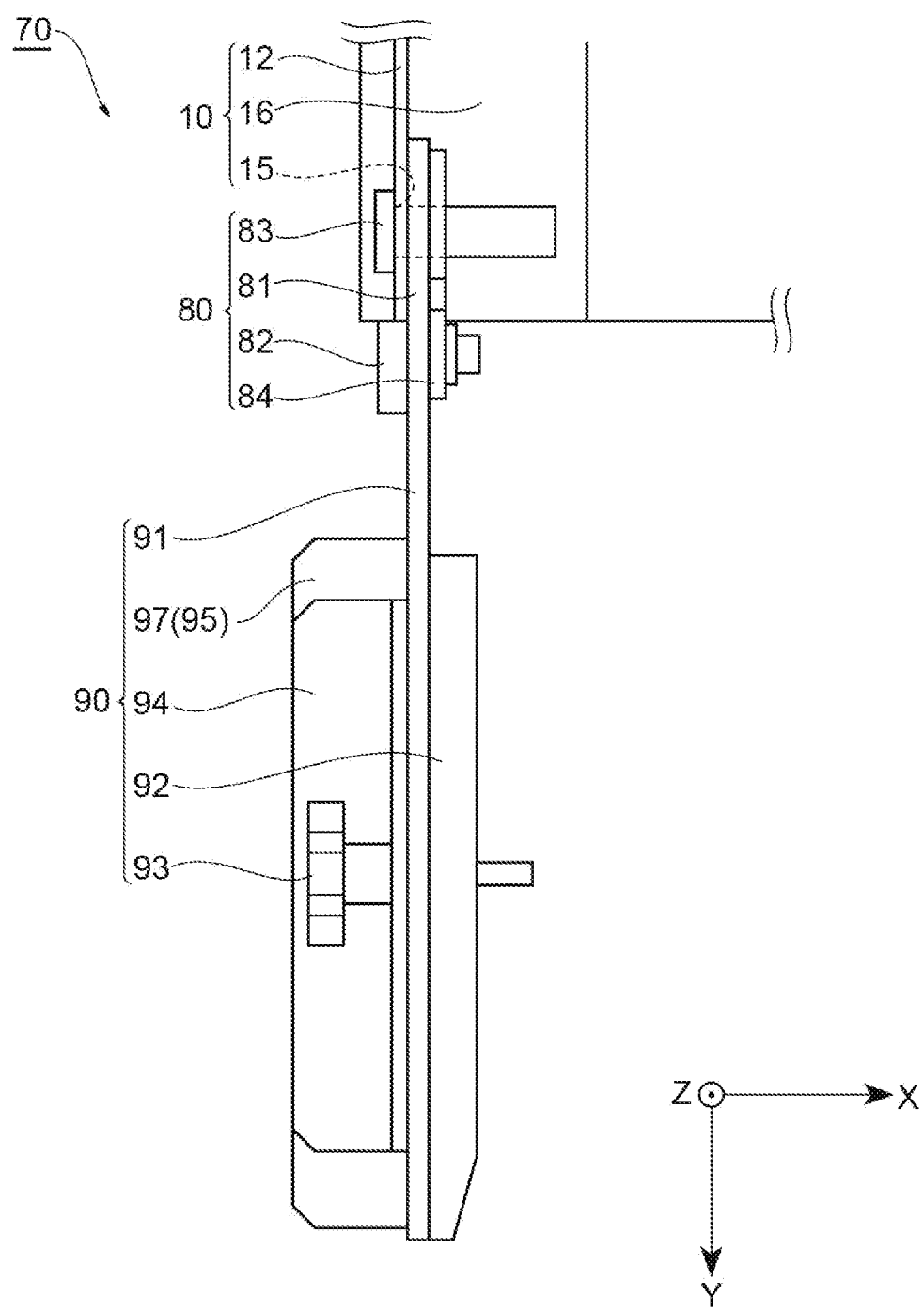
FIG. 10 is a plan view of the attachment illustrated in FIG. 9.

As illustrated in FIGS. 9 and 10, each of the pair of attachments 70 includes a connecting portion 80 and an extending portion 90. Each of the pair of attachments 70 includes a reinforced portion 99. The pair of attachments 70 are detachably provided to the attaching portion 15 of the transfer target shelf 11. The pair of attachments 70 are detachably connected to the main unit portion 30 so as to sandwich the main unit portion 30 from the outside in the X-direction.

The connecting portion 80 is attached to the attaching portion 15 of the storage device 10. The connecting portion 80 includes a connecting plate 81, a wall contact portion 82, a plurality of attachment fasteners 83, and a plurality of attaching hooks 84. The connecting plate 81 is a plate-like member extending along the Z-direction. The connecting plate 81 is provided on the inside with respect to the attaching portion 15 in the X-direction. The connecting plate 81 has a plurality of small holes into which each of the attachment fasteners 83 can be fitted inward in the X-direction. The wall contact portion 82 is provided on the outer surface of the connecting plate 81. When the main unit portion 30 is attached to the attaching portion 15 of the transfer target shelf 11, the surface on the rear side of the wall contact portion 82 comes into contact with the surface on the front side of the sidewall portion 12. The wall contact portion 82 is a substantially rectangular parallelepiped-like member.

Each attachment fastener 83 couples the attaching portion 15 and the connecting plate 81. Each attachment fastener 83 is a screw, a pin or the like, for example. Each attachment fastener 83 is fitted into the respective small holes of the attaching portion 15 and the connecting plate 81 and extends from the outside to the inside, thereby restricting the moving of each attachment 70 in the Y-direction and the Z-direction.

Each attaching hook 84 is a hook-like member rotatably provided on the connecting plate 81. As each attaching hook 84 turns centering around the turning axis thereof, a hook portion of each attaching hook 84 engages with the respective attachment fasteners 83. As a result, each attachment fastener 83 is less likely to come off the respective small holes of the attaching portion 15 and the connecting plate 81. In each attaching hook 84, by turning the hook portion thereof in a direction to separate from the respective attachment fasteners 83, the engagement of the hook portion of each attaching hook 84 and the respective attachment fasteners 83 can be released. The number of the attaching hooks 84 provided is equal to or greater than the number of the attachment fasteners 83.

The extending portion 90 extends from the connecting portion 80 to the front side (one side) and supports the main unit portion 30. The extending portion 90 includes an extending plate 91, an engaging projecting portion 92, a main body fastener 93, a fastener support base 94, and a height adjusting unit 95. The extending plate 91 is a plate-like member extending along the Y-direction. The extending plate 91 is connected to the connecting plate 81 at the end portion on the rear side thereof. The extending plate 91 has a small hole to which the main body fastener 93 can be fitted inward in the X-direction.

The engaging projecting portion 92 fixes, by engaging with the engaging recessed portion 33 of the main unit portion 30, the main unit portion 30 in the X-direction with respect to the transfer target shelf 11. The engaging projecting portion 92 is movably provided in the Z direction. The engaging projecting portion 92 is a projecting portion extending in the Y-direction, provided on the inside of the extending plate 91 in the X-direction, and projecting inward. The engaging projecting portion 92 is engaged from the rear end portion of the engaging recessed portion 33 in the main unit portion 30 with respect to the front end portion of the engaging projecting portion 92 and the engaging recessed portion 33 is inserted to move to the rear side with respect to the engaging projecting portion 92, thereby engaging the main unit portion 30 and each attachment 70. As a result, the engaging projecting portion 92 horizontally supports the main unit portion 30. The engaging projecting portion 92 is restricted, by the engaging stopper 34, from projecting from the engaging recessed portion 33 to the front side. The length of the engaging projecting portion 92 in the Y-direction is a length shorter than or the same as the length of the engaging recessed portion 33. The engaging projecting portion 92 has a small hole into which the main body fastener 93 can be fitted inward in the X-direction.

The main body fastener 93, by fitting into the small holes of the engaging recessed portion 33, the extending plate 91, and the engaging projecting portion 92, fixes the main unit portion 30 and each attachment 70 in the Y-direction and the Z-direction. The main body fastener 93 is a screw, a pin or the like, for example. The small hole of the extending plate 91 extends in the Z-direction as compared with the small holes of the engaging recessed portion 33 and the engaging projecting portion 92. The main body fastener 93 positions, by fitting into the small holes after the engaging recessed portion 33 of the main unit portion 30 and the engaging projecting portion 92 are engaged, the main unit portion 30 and each attachment 70.

The fastener support base 94 is provided on the outer surface of the extending plate 91 in the X-direction. The fastener support base 94 is rotatably connected to the main body fastener 93. The fastener support base 94 has a small hole into which the main body fastener 93 can be fitted inward in the X-direction. The main body fastener 93 is fitted, from the outside in the X-direction, into the small holes in the order of the fastener support base 94, the extending plate 91, the engaging projecting portion 92, and the engaging recessed portion 33. Each hole of the engaging recessed portion 33, the engaging projecting portion 92, and the fastener support base 94 has a small extending length in the Z-direction compared to the small hole of the extending plate 91. Each small hole of the engaging recessed portion 33, the engaging projecting portion 92, and the fastener support base 94 has a diameter one size larger than the diameter of the fitting portion of the main body fastener 93.

The height adjusting unit 95 adjusts the height of the fastener support base 94 in the Z-direction. The height adjusting unit 95 includes a height adjustment base 96 and a plurality of height adjustment screws 97. The height adjustment base 96 is provided fixed on the outer surface of the extending plate 91 in the X-direction and below the fastener support base 94. The height adjustment base 96 has a plurality of screw holes in the Z-direction. The height adjustment screws 97 fit in the screw holes provided on the height adjustment base 96 along the Z-direction, and project above the height adjustment base 96. As the upper end portion of each height adjustment screw 97 comes into contact with the fastener support base 94, each height adjustment screw 97 supports the fastener support base 94. Each height adjustment screw 97 changes, by turning, the length of the portion projecting above from the height adjustment base 96. This adjusts the position in the Z-direction of the fastener support base 94 that is supported by the upper end of each height adjustment screw 97. That is, by increasing the length of the portion projecting above from the height adjustment base 96, the position in the Z-direction of the fastener support base 94 moves upward. By decreasing the length of the portion projecting above from the height adjustment base 96, the position in the Z-direction of the fastener support base 94 moves downward. The main body fastener 93 moves in the Z-direction by contacting the edge of the small hole of the fastener support base 94 that moves. The main body fastener 93 that moves, by contacting the edge of each of the small holes of the engaging recessed portion 33 and the engaging projecting portion 92, moves the main unit portion 30 and the engaging projecting portion 92 in the Z-direction.

The reinforced portion 99 is bridged between the connecting portion 80 and the extending portion 90. The reinforced portion 99 connects the lower end of the connecting plate 81 of the connecting portion 80 and the front end portion of the extending plate 91 of the extending portion 90 and supports the extending plate 91. The reinforced portion 99 has a plate shape. To reduce the weight of each attachment 70, the area surrounded by the connecting plate 81, the extending plate 91, and the reinforced portion 99 is open. In each attachment 70, the connecting plate 81, the extending plate 91, and the reinforced portion 99 are one plate-like member.

Transfer Method

Figure 11:
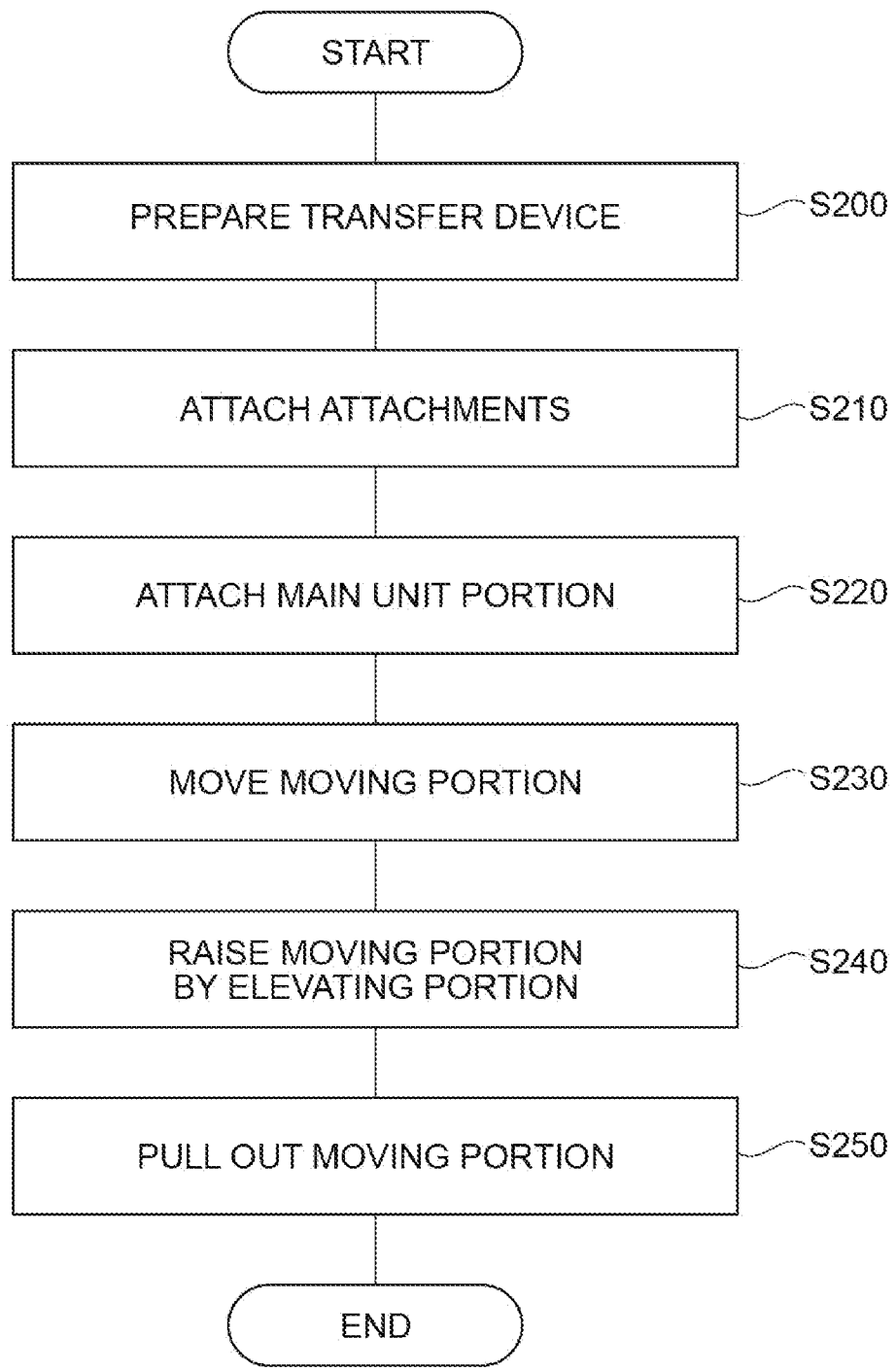
FIG. 11 is a flowchart of a transfer method of the example.

Next, a transfer method performed using the transfer device 20 for transferring the container 9 with respect to the transfer target shelf 11 from the front side will be described. First, as illustrated in FIG. 11, a transfer method for carrying out the container 9 from the front side with respect to the transfer target shelf 11 by using the transfer device 20 will be described. At this time, the container 9 is placed on the pair of placement tables 16 of the placement portion 14 in the storage device 10.

First, a worker prepares the transfer device 20 (S200: first step). The worker carries the transfer device 20 and enters between the pair of storage devices 10 where the crane 3 is provided.

Subsequently, the worker attaches each of the pair of attachments 70 to the attaching portion 15 for the transfer target shelf 11 in the storage device 10 (S210). The worker attaches the connecting portion 80 to the attaching portion 15. By fitting each attachment fastener 83 into the respective small holes of the attaching portion 15 and the connecting plate 81, the attaching portion 15 and the connecting plate 81 are coupled. By turning each attaching hook 84, the attachment fastener 83 is engaged with the attaching hook 84 so that each attachment fastener 83 is less likely to come off the respective attaching portion 15 and the connecting plate 81.

Figure 12:
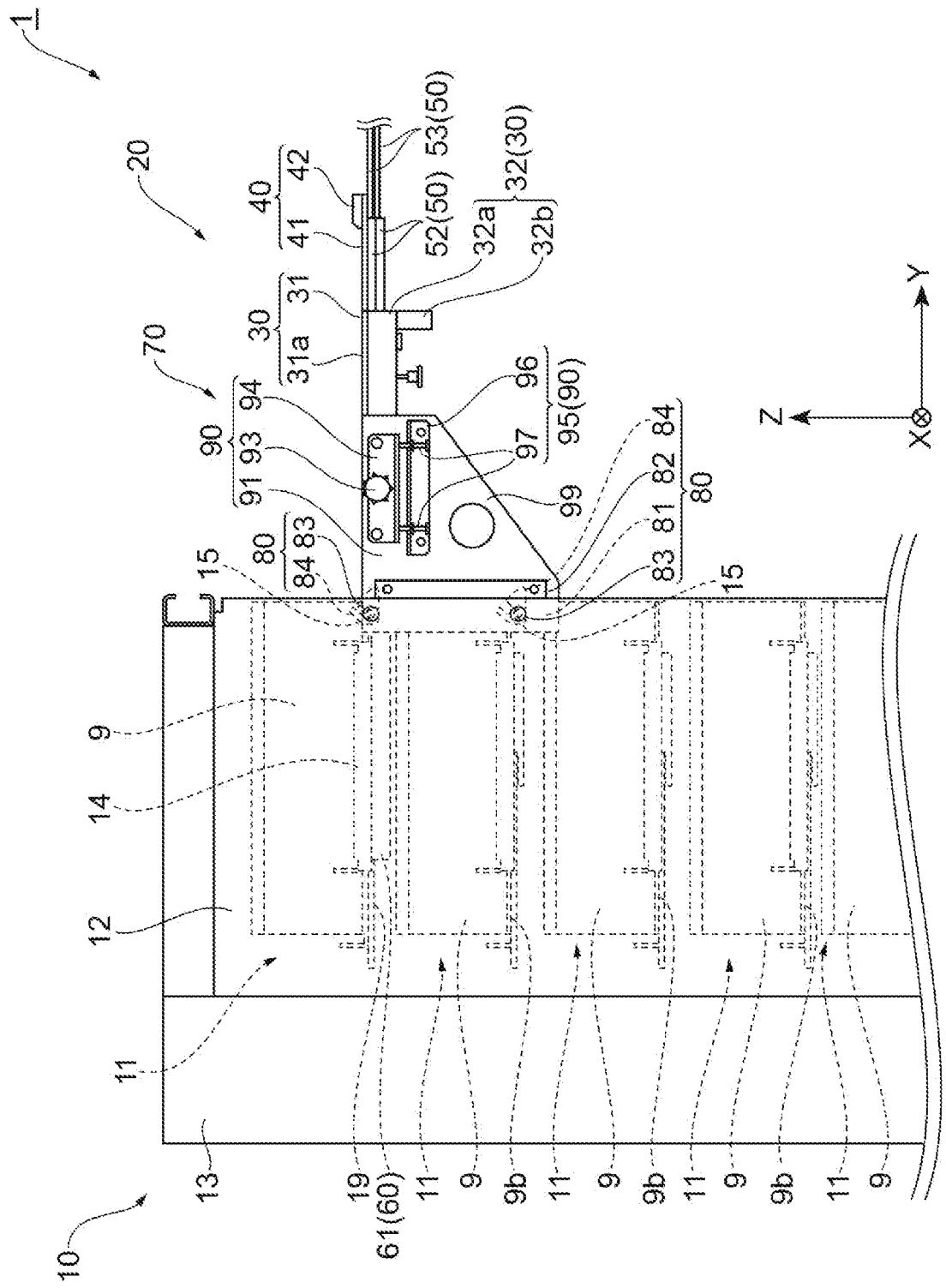
FIG. 12 is a side view of the transfer system in which the transfer method illustrated in FIG. 11 is being conducted.

Then, the worker attaches the main unit portion 30 to the attaching portion 15 of the transfer target shelf 11 from the front side via the pair of attachments 70 (S220: second step). As illustrated in FIG. 12, the worker attaches the pair of attachments 70 to the attaching portion 15 of the transfer target shelf 11 and attaches the main unit portion 30 to the pair of attachments 70. The worker engages the pair of engaging recessed portions 33 of the main unit portion 30 with the pair of engaging projecting portions 92 and moves them to the rear side. As the pair of engaging projecting portions 92 contacts the pair of engaging stoppers 34 of the main unit portion 30, projecting of the pair of engaging projecting portions 92 to the front side is restricted. The main body fastener 93 is fitted, from the outside, into the respective small holes in the order of the fastener support base 94, the extending plate 91, the engaging projecting portion 92, and the engaging recessed portion 33. As a result, the main unit portion 30 and the pair of attachments 70 are fixed and the main unit portion 30 is attached to the attaching portion 15 via the pair of attachments 70. As the main unit portion 30 is moved to the rear side when engaging the pair of engaging recessed portions 33 with the pair of engaging projecting portions 92, the linear guide 61 of the guide 60 is inserted into the space 19 of the transfer target shelf 11. When the moving portion 40 is difficult to move toward the space 19 or the insertion of the linear guide 61 is stalled, the position in the Z-direction of the main body fastener 93 is adjusted by the height adjusting unit 95. As a result, the positions of the moving portion 40 connected to the main unit portion 30 and the linear guide 61 in the Z-direction are adjusted, thereby facilitating the movement of the moving portion 40 and the insertion of the linear guide 61.

Subsequently, in a state where the moving portion 40 is lowered, the worker moves the moving portion 40 to the space 19 that is the space directly below the opening region 14a of the transfer target shelf 11 (S230: third step). As the check valve 55 is opened in the elevating portion 50, gas in each balloon portion 51 is released to the outside. This causes the moving plate 41 of the moving portion 40 to be in a lowered state. The worker grips the grip portion 42 of the moving portion 40 and moves the moving plate 41 to the rear side along the linear guide 61, thereby inserting the moving plate 41 into the space 19 of the transfer target shelf 11. The moving plate 41 can move to the rear side until the contact portion 46 comes into contact with the carry-in stopper 62. The moving plate 41 is inserted into the space 19 so that the protruding portion 44 is positioned directly below the recess provided on the bottom portion 9b of the container 9 on the pair of placement tables 16.

Figure 13:
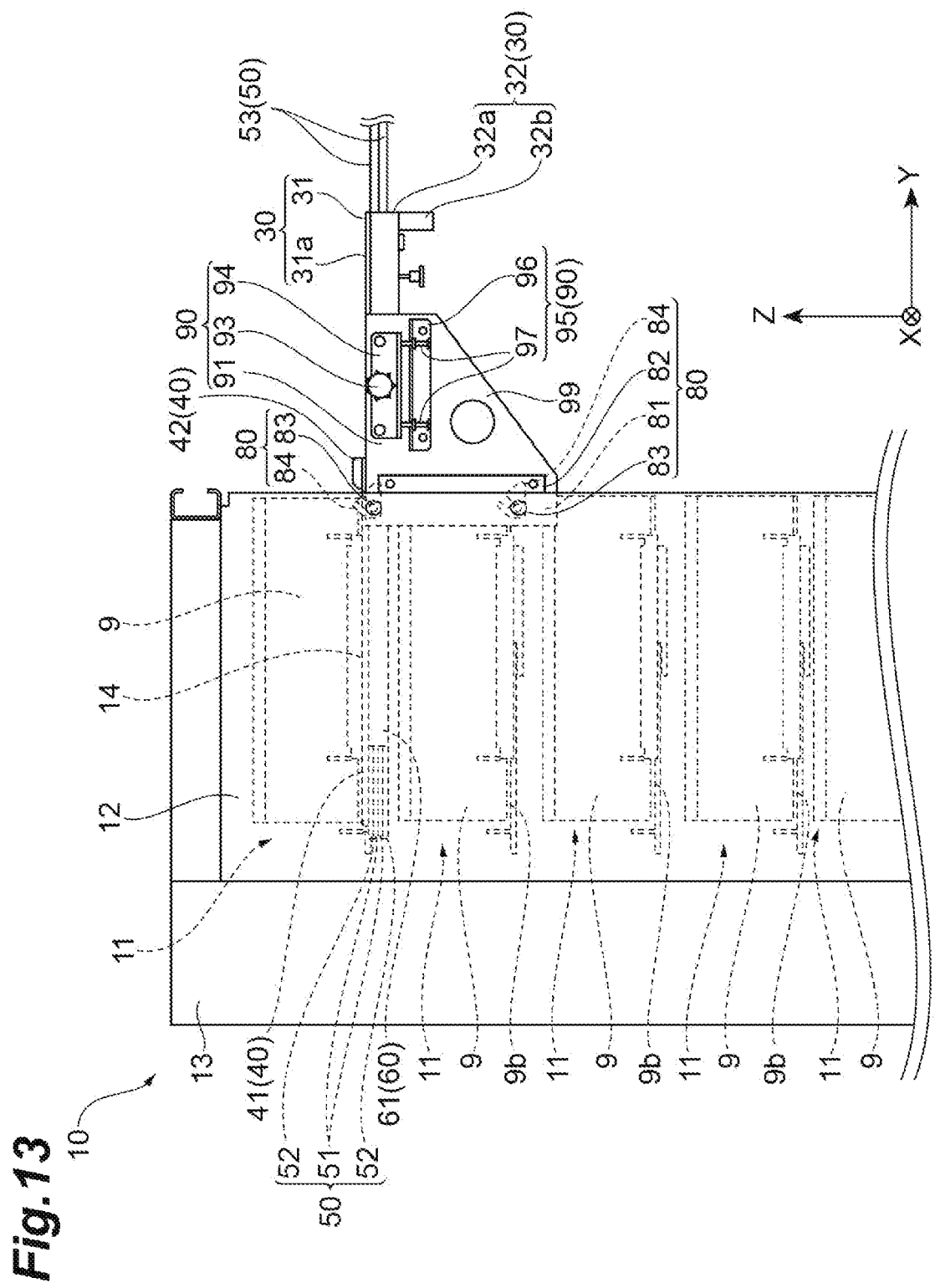
FIG. 13 is a side view of the transfer system in which the transfer method illustrated in FIG. 11 is being conducted.

Subsequently, the worker raises the moving portion 40 through the opening region 14a of the transfer target shelf 11 by using the elevating portion 50 and causes the moving portion 40 to support the container 9 (S240: fourth step). As illustrated in FIG. 13, the worker moves the moving plate 41 of the moving portion 40 to the rear side and raises the moving plate 41. The worker supplies gas, by using the manual pump 56, to the inside of each balloon portion 51 through each air tube 53 and each coupling tool 54. Each balloon portion 51 expands as the gas is supplied and raises the moving plate 41. By being raised, the moving plate 41 passes upward through the opening region 14a of the transfer target shelf 11. When the moving plate 41 is located at the same height as the pair of placement tables 16, the moving plate 41 contacts the container 9 and the protruding portion 44 engages with the recess provided in the middle of the bottom portion 9b of the container 9. As the moving plate 41 is further raised, the container 9 is supported by the moving plate 41.

Then, the worker moves the moving portion 40 supporting the container 9 to the main unit portion 30 (S250: fifth step). The worker grips the grip portion 42 of the moving portion 40 and moves the moving plate 41 to the front side along the linear guide 61 while each balloon portion 51 is expanded, thereby carrying out the moving plate 41 supporting the container 9 from the transfer target shelf 11. The moving plate 41 can be moved to the front side until the contact portion 46 comes into contact with the carry-out stopper 63. The worker may deflate each balloon portion 51 of the elevating portion 50. That is, as illustrated in FIG. 3, the worker may lower the moving plate 41 by the elevating portion 50 in a state where the moving plate 41 is moved to the front side and place the container 9 on the upper surface 31a of each supporting portion 31 of the main unit portion 30. When the fifth step (S250) ends, the transfer method illustrated in FIG. 11 ends. As a result, the container 9 is carried out from the transfer target shelf 11.

Next, a transfer method for carrying in the container 9 from the front side with respect to the transfer target shelf 11 by using the transfer device 20 will be described. First, the worker prepares the transfer device 20. The worker performs the same work as the preparation work (S200) of the transfer device 20 in the transfer method of carry-out.

Subsequently, as a work of attaching the attachments, the worker attaches each of the pair of attachments 70 to the attaching portion 15 for the transfer target shelf 11 in the storage device 10. The worker performs the same work as the attachment work (S210) of the pair of attachments 70 in the transfer method of carry-out.

Then, as an attachment work of the main unit portion 30, the worker attaches the main unit portion 30 to the attaching portion 15 of the transfer target shelf 11 from the front side. The worker performs the same work as the attachment work (S220) of the main unit portion 30 in the transfer method of carry-out. At this time, by the worker, the container 9 is placed on the pair of supporting portions 31 of the main unit portion 30 or the moving plate 41 of the moving portion 40.

Then, as a raising work of the moving portion 40 by the elevating portion 50, the worker raises the moving portion 40 by using the elevating portion 50 and causes only the moving portion 40 to support the container 9. The worker supplies gas, by using the manual pump 56, to the inside of each balloon portion 51 through each air tube 53 and each coupling tool 54. Each balloon portion 51 expands as the gas is supplied and raises the moving plate 41. When the moving plate 41 is located at the same height as the pair of supporting portions 31, the moving plate 41 contacts the container 9 and the protruding portion 44 engages with the recess provided in the middle of the bottom portion 9b of the container 9. As the moving plate 41 is further raised, the container 9 is supported only by the moving plate 41. If the elevating portion 50 is in a raised state at the time of the attachment work of the main unit portion 30, there may be no need to perform the raising work of the moving portion 40 by this elevating portion 50. At this time, the worker places the container 9 so that the recess provided in the middle of the bottom portion 9b of the container 9 engages with the protruding portion 44.

Subsequently, as a moving work of the moving portion 40, the worker moves the moving portion 40 to the opening region 14a of the transfer target shelf 11 in a state where the moving portion 40 is raised. The worker grips the grip portion 42 of the moving portion 40 and moves the moving plate 41 to the rear side along the linear guide 61, thereby inserting the moving plate 41 directly above the opening region 14a through the transfer opening of the transfer target shelf 11. Directly above the opening region 14a of the transfer target shelf 11 means the region between the opening region 14a of the relevant transfer target shelf 11 and the opening region 14a of the shelf 11 one stage above the relevant transfer target shelf 11. The moving plate 41 can be moved to the rear side until the contact portion 46 comes into contact with the carry-in stopper 62. The moving plate 41 is moved up to a state where the container 9 does not project from the front end portion of the transfer target shelf 11.

Then, as a lowering work of the moving portion 40 by the elevating portion 50, using the elevating portion 50 lowers the moving portion 40 and causes only the pair of placement tables 16 of the placement portion 14 in the transfer target shelf 11 to support the container 9. The worker discharges gas, by releasing the check valve 55, from the inside of each balloon portion 51 through each air tube 53 and each coupling tool 54. Each balloon portion 51 deflates as the gas is discharged and lowers the moving plate 41. When the moving plate 41 has moved below the pair of placement tables 16 through the opening region 14a, the contact between the container 9 and the moving plate 41 is released and the engagement of the recess provided in the middle of the bottom portion 9b of the container 9 with the protruding portion 44 is released. The container 9 is placed on the pair of placement tables 16 of the placement portion 14. As the moving plate 41 is further lowered, the moving plate 41 is located at the space 19. This causes the moving plate 41 of the moving portion 40 to be in a lowered state.

Subsequently, as a pull-out work of the moving portion 40, the worker moves the moving portion 40 up to the main unit portion 30. The worker grips the grip portion 42 of the moving portion 40 and moves the moving plate 41 to the front side along the linear guide 61 while each balloon portion 51 is deflated, thereby pulling out the moving plate 41 from the transfer target shelf 11. The moving plate 41 can be moved to the front side until the contact portion 46 comes into contact with the carry-out stopper 63. When the pull-out work of the moving portion 40 ends, the transfer method of carrying in the container 9 ends.

Operation and Effect

According to the transfer system 1, the transfer device 20, and the transfer method, the worker can transfer the container 9 easily and stably regardless of the height of the transfer target shelf 11. When the worker transfers the container 9 to the storage device 10 as it is not possible to transfer the container 9 automatically due to a malfunction and the like of the system control unit 7 of the storage system 100, the worker can utilize the transfer system 1, the transfer device 20, and the transfer method. In addition, when the distance between the containers 9 placed on the shelves 11 in the Z-direction is narrow and it is difficult for the worker to manually lift the container as the container 9 is heavy, the worker can utilize the transfer system 1, the transfer device 20, and the transfer method. In these instances, merely attaching the main unit portion 30 of the transfer device 20 to the attaching portion 15 of the transfer target shelf 11, the worker can easily transfer the container 9 to the transfer target shelf 11.

Furthermore, as the pair of attachments 70 are provided for the transfer target shelf 11, the main unit portion 30 is supported by the extending portion 90 extending from the connecting portion 80 to the front side so that the container 9 can be transferred in a stable state. As the pair of attachments 70 include the reinforced portion 99, the load capacity of the pair of attachments 70 increases so that the container 9 can be transferred in a stable state, even if the container 9 is heavy, for example.

As the elevating portion 50 is an air jack, the transfer device 20 can be made light in weight so that the transfer device 20 can be attached to the attaching portion 15 of the storage device 10 more easily. As the transfer device 20 has the guide 60, the moving portion 40 is guided by the guide 60 extending along the Y-direction so that the container 9 can be transferred to the transfer target shelf 11 in a more stable state. As the worker merely attaches the main unit portion 30 of the transfer device 20 to the attaching portion 15 of the transfer target shelf 11, the guide 60 turns into a state of extending to the space 19 directly below the opening region 14a of the transfer target shelf 11 so that an extra workload for the worker can be prevented from arising. The guide 60 may be the linear guide 61, and with a simple configuration, the container 9 can be transferred in a more stable state.

The container 9 may be a container storing semiconductor wafers, the container storing the semiconductor wafers that are precision devices can be easily transferred. The moving portion 40 includes the non-slip portion 43 or the protruding portion 44 so that the container 9 can be prevented from slipping off the moving plate 41. The attachment fastener 83 fits in the small holes provided in the attaching portion 15 and the connecting plate 81 from the outside to the inside and is easily removed after finishing the transfer of the container 9 so that an extra workload for the worker can be prevented from arising.

Modifications

This disclosure is not limited to the above-described example. For example, the material and the shape of each constituent element are not limited to the above-described material and the shape, and various materials and shapes may be employed. For example, the container 9 may be a container such as a reticle pod and the like storing a plurality of glass substrates and an article such as general components and the like. The pair of placement tables 16 may be coupled via a coupling member on the backside. In this configuration, the pair of placement tables 16 are coupled to not interfere with the moving portion 40 that is raised and lowered through the opening region 14a.

The main unit portion 30 need not include the pair of supporting portions 31. In this configuration, before and after the transferring of the container 9, only the moving plate 41 supports the container 9. The main unit portion 30 need not include the pair of engaging recessed portions 33. In this configuration, each attachment 70 need not the include engaging projecting portion 92. In the connection between the main unit portion 30 and each attachment 70, the main unit portion 30 may be fixed by using a plurality of attachment fasteners 83 per one attachment 70. As a result, the main unit portion 30 is horizontally supported. That is, the moving plate 41 of the moving portion 40 that is connected to the main unit portion 30 is fixed to each attachment 70 to be horizontal. The main unit portion 30 need not include the pair of engaging stoppers 34. In this configuration, the main unit portion 30 contacts the transfer target shelf 11 or the attaching portion 15, thereby preventing the main unit portion 30 from moving to the rear side. The main unit portion 30 may include the pair of engaging projecting portions 92 in place of the pair of engaging recessed portions 33 and the pair of attachments 70 may include the pair of engaging recessed portions 33 in place of the pair of engaging projecting portions 92.

The moving portion 40 may be a mechanism that moves along the Y-direction by the power of a drive source such as a motor. The moving portion 40 may be a mechanism that moves along the Y-direction by a hydraulic jack, an electric jack, an air jack, a ball screw or the like. The moving portion 40 need not include the grip portion 42. In this configuration, the worker moves the moving plate 41 by directly grasping the moving plate 41. The moving portion 40 need not include the non-slip portion 43 or the protruding portion 44. The slider 45 may be arranged to press the member extending in the Y-direction of the linear guide 61 of the guide 60 from the inside to the outside in the X-direction.

The elevating portion 50 need not be an air jack. The elevating portion 50 may be a mechanism that elevates in the Z-direction by the power of a drive source such as a motor. The elevating portion 50 may be a hydraulic jack, an electric jack, or a ball screw. The balloon portions 51 may be on the inside of the moving plate 41 in the Y-direction. In this configuration, the linear guide 61 is provided below the moving plate 41 and on the outside in the Y-direction. One balloon portion 51 may be provided in the Z-direction per one edge side along the Y-direction of the moving plate 41. In this configuration, one coupling tool 54 is provided. As for the balloon portion 51, one balloon portion 51 may be provided with respect to the moving plate 41. In this configuration, the coupling tool 54 need not be provided. The coupling tool 54 need not be provided when the air tube 53 includes one tube.

The transfer device 20 need not include the guide 60. In this configuration, the moving portion 40 may have a handle member extending in the Y-direction on the front side of the moving plate 41, for example. The handle member has a length that allows the moving plate 41 to move directly below the opening region 14a. When transferring the container 9 with respect to the transfer target shelf 11, the worker grips the handle member and moves the moving portion 40 and the elevating portion 50 along the Y-direction. The linear guide 61 of the guide 60 may be made of one or a plurality of lengthy members extending in the Y-direction. The guide 60 need not extend to the space 19 directly below the opening region 14a. In this configuration, the position of the slider 45 in the moving portion 40 may be adjusted to make the moving plate 41 of the moving portion 40 movable to the space 19 directly below the opening region 14a and allow the moving plate 41 to support the container 9, and the length of the moving plate 41 in the Y-direction extending from the slider 45 to the rear side may be adjusted.

The transfer device 20 need not include the pair of attachments 70. In this configuration, the main unit portion 30 is directly attached to the attaching portion 15 from the front side without using the pair of attachments 70. For example, each supporting portion 31 of the main unit portion 30 may have a small hole on the side surface on the rear side in the Y-direction and on the outside in the X-direction. The worker may, by fitting the attachment fastener 83 into a small hole of each attaching portion 15 and each supporting portion 31, directly attach the main unit portion 30 to the attaching portion 15. The attachment 70 need not be a pair. In this configuration, the transfer device 20 has one attachment 70, and the main unit portion 30 has one engaging recessed portion 33, for example. Each attachment 70 may be connected, in the Z-direction, to the attaching portion 15 located above relative to the main unit portion 30. In this configuration, it is arranged so that the lower end of the connecting plate 81 of the connecting portion 80 and the end portion on the rear side of the extending plate 91 of the extending portion 90 are connected and that the reinforced portion 99 connects the upper end of the connecting plate 81 of the connecting portion 80 and the end portion on the front side of the extending plate 91 of the extending portion 90. The connecting plate 81 may be provided, in the X-direction, on the outside with respect to the attaching portion 15 and the wall contact portion 82. Only one attachment fastener 83 may be provided on each of the pair of attachments 70. When the upper end of the connecting plate 81 of the connecting portion 80 and the end portion on the rear side of the extending plate 91 of the extending portion 90 are connected, one attachment fastener 83 is fitted to the upper portion of the connecting plate 81. When the lower end of the connecting plate 81 of the connecting portion 80 and the end portion on the rear side of the extending plate 91 of the extending portion 90 are connected, one attachment fastener 83 is fitted to the lower portion of the connecting plate 81.

On each of the pair of attachments 70, a plurality of engaging projecting portions 92 may be provided in the Y-direction. In this configuration, the engaging projecting portion 92 is a member extending in the Y-direction, and the engaging projecting portions 92 are provided at intervals in the Y-direction. Each engaging recessed portion 33 of the main unit portion 30 supports, by engaging with the respective engaging projecting portions 92 in the Y-direction, the main unit portion 30 horizontally. The pair of engaging projecting portions 92 may be a projecting portion provided on the outside of the extending plate 91 in the X-direction and extending in the Y-direction. In this configuration, the pair of engaging recessed portions 33 of the main unit portion 30 are connected on the outside of the pair of engaging projecting portions 92. Each supporting member 32a is provided on the outside of each engaging projecting portion 92 and each supporting member 32a extends above or below the extending plate 91 of each attachment 70. The number of the screw holes of the height adjustment base 96 and the number of the height adjustment screws 97 may be one each. Each attachment 70 need not include the reinforced portion 99. The area surrounded by the connecting plate 81, the extending plate 91, and the reinforced portion 99 need not be open. In each attachment 70, the connecting plate 81, the extending plate 91, and the reinforced portion 99 need not be one plate-like member and may be a plurality of plate-like members.

The transfer method need not include the attachment work (S210) of the pair of attachments 70. In this configuration, as the second step, the worker directly attaches the main unit portion 30 to the attaching portion 15 from the front side without using the pair of attachments 70. The transfer method may include the work of removing the main unit portion 30 from the pair of attachments 70 or the work of removing the pair of attachments 70 from the attaching portion 15. In the transfer method, when the moving plate 41 is moved to the transfer target shelf 11, not all of the moving plate 41 need be inserted into the inside of the space 19. In the moving work of the moving portion 40 (S230) when the container 9 is carried out with respect to the transfer target shelf 11, the moving plate 41 is inserted at least on the rear side relative to the center of gravity of the container 9. In the moving work of the moving portion 40 when the container 9 is carried in with respect to the transfer target shelf 11, the moving plate 41 is inserted so that the end portion on the front side of the container 9 placed on the moving plate 41 is located on the rear side relative to the attaching portion 15.

The invention claimed is:

1. A transfer system comprising:
   a storage device including a plurality of shelves arrayed in an up-and-down direction and on which an article is transferred from one side in a horizontal one direction, each of the shelves including a placement portion in which an opening region that is open in the up-and-down direction and open on the one side is formed and on which the article is placed, and an attaching portion provided according to a position of the placement portion in the up-and-down direction; and
   a transfer device that transfers the article, with each of the shelves as a transfer target shelf, from the one side with respect to the transfer target shelf, wherein
   the transfer device comprises
      a main unit portion attached to the attaching portion of the transfer target shelf from the one side,
      a moving portion including a grip portion that allows a worker to apply a force along the one direction while holding the grip portion, the moving portion being capable of supporting the article and configured to move between the main unit portion and the transfer target shelf along the one direction in a state where the main unit portion is attached to the attaching portion of the transfer target shelf, and
      an elevating portion configured to elevate the moving portion through the opening region of the transfer target shelf in a state where the main unit portion is attached to the attaching portion of the transfer target shelf,
   wherein,
   the transfer device further comprises a guide configured to guide the moving portion along the one direction,
   the guide extends from the main unit portion in a state where the main unit portion is not attached to the attaching portion of the transfer target shelf, and
   the guide extends from the main unit portion to directly below the opening region of the transfer target shelf in a state where the main unit portion is attached to the attaching portion of the transfer target shelf.

2. The transfer system according to claim 1, wherein the transfer device further comprising a pair of attachments,
   each of the pair of attachments comprise
      a connecting portion attached to the attaching portion of the transfer target shelf, and
      an extending portion extending from the connecting portion to the one side and configured to support the main unit portion, and
   the main unit portion is attached to the attaching portion via the pair of attachments.

3. The transfer system according to claim 2, wherein the connecting portion extends along the up-and-down direction, and
   each of the pair of attachments further includes a reinforced portion bridged between the connecting portion and the extending portion.

4. The transfer system according to claim 1, wherein the elevating portion is an air jack.

5. The transfer system according to claim 1, wherein the guide is a linear guide.

6. The transfer system according to claim 1, wherein the article is a container storing a semiconductor wafer.

7. A transfer method executed in the transfer system according to claim 1, comprising:
   preparing the transfer device;
   attaching the main unit portion to the attaching portion of the transfer target shelf from the one side;
   causing an operator to move the moving portion along the one direction to directly below the opening region of the transfer target shelf by holding the grip portion and applying a force along the one direction in a state where the moving portion is lowered;
   raising the moving portion through the opening region of the transfer target shelf by using the elevating portion, and causing the moving portion to support the article; and
   causing an operator to move the moving portion to the main unit portion along the one direction by holding the grip portion and applying a force along the one direction in a state where the moving portion is raised.

8. A transfer device in a storage device including a plurality of shelves that are arrayed in an up-and-down direction and on which an article is transferred from one side of a horizontal one direction, each of the shelves including a placement portion in which an opening region that is open in the up-and-down direction and open on the one side is formed and on which the article is placed, and an attaching portion provided according to a position of the placement portion in the up-and-down direction that transfers the article, with each of the shelves as a transfer target shelf, from the one side with respect to the transfer target shelf, the transfer device comprising:
   a main unit portion attached to the attaching portion of the transfer target shelf from the one side;
   a moving portion including a grip portion that allows a worker to apply a force along the one direction while holding the grip portion, the moving portion being capable of supporting the article and configured to move between the main unit portion and the transfer target shelf along the one direction in a state where the main unit portion is attached to the attaching portion of the transfer target shelf; and
   an elevating portion configured to elevate the moving portion through the opening region of the transfer target shelf in a state where the main unit portion is attached to the attaching portion of the transfer target shelf,
   wherein,
   the transfer device further comprises a guide configured to guide the moving portion along the one direction,
   the guide extends from the main unit portion in a state where the main unit portion is not attached to the attaching portion of the transfer target shelf, and
   the guide extends from the main unit portion to directly below the opening region of the transfer target shelf in a state where the main unit portion is attached to the attaching portion of the transfer target shelf.

* * * * *